(12) United States Patent
Cavaleri et al.

(10) Patent No.: US 6,477,101 B2
(45) Date of Patent: Nov. 5, 2002

(54) READ-AHEAD ELECTRICALLY ERASABLE AND PROGRAMMABLE SERIAL MEMORY

(75) Inventors: Paola Cavaleri; Bruno Leconte, both of Rousset; Sébastien Zink, Aix-en-Provence, all of (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/795,657

(22) Filed: Feb. 28, 2001

(65) Prior Publication Data

US 2001/0021117 A1 Sep. 13, 2001

(30) Foreign Application Priority Data

Feb. 28, 2000 (FR) .............................. 00 02449

(51) Int. Cl.[7] ................................ G11C 7/00
(52) U.S. Cl. ................. 365/221; 365/239; 365/230.01; 365/235
(58) Field of Search ................. 365/221, 240, 365/239, 230.01, 230.06, 235

(56) References Cited

U.S. PATENT DOCUMENTS

| 4,723,228 A | 2/1988 | Shah et al. ................. 365/230 |
| 4,797,858 A | 1/1989 | Wang et al. ................. 365/230 |
| 5,663,922 A * | 9/1997 | Tailliet ........................ 365/240 |
| 5,691,956 A * | 11/1997 | Chang et al. ................ 365/239 |

FOREIGN PATENT DOCUMENTS

FR 0712133 A1 * 5/1996

* cited by examiner

Primary Examiner—Richard Elms
Assistant Examiner—VanThu Nguyen
(74) Attorney, Agent, or Firm—Lisa K. Jorgenson; Allen, Dyer, Doppelt, Milbrath & Gilchrist, P.A.

(57) ABSTRACT

A serial input/output memory is able to read data in the memory upon reception of a partial read address in which there are N least significant bits lacking to form a complete address. The read-ahead step includes: simultaneously reading the P first bits of M words of the memory having the same partial address; when the received address is complete, selecting the P first bits of the word designated by the complete address and delivering these bits at the serial output of the memory; reading P following bits of the word designated by the complete address during the delivery of P previous bits and delivering these bits at the serial output of the memory when the P previous bits are delivered.

36 Claims, 12 Drawing Sheets

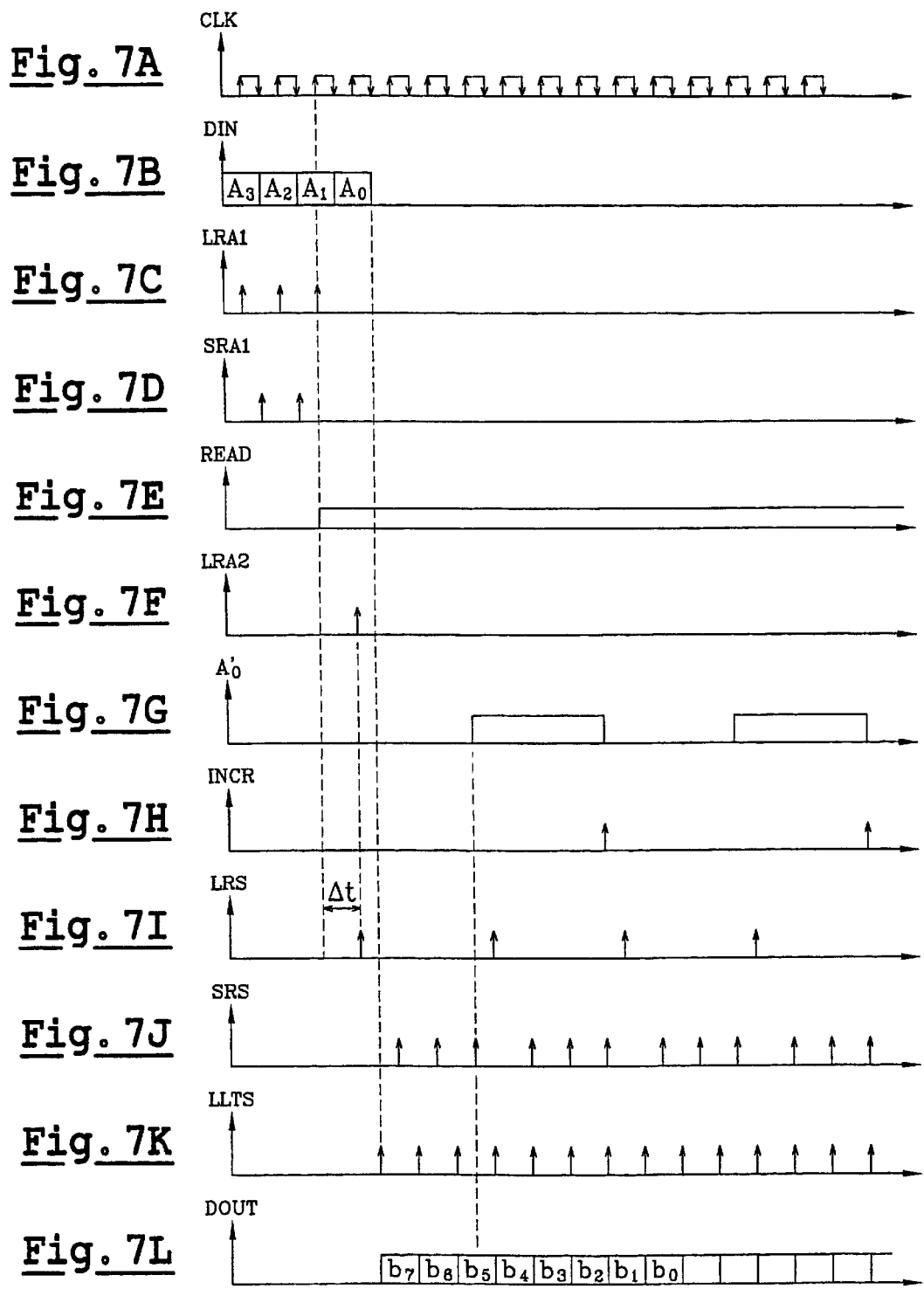

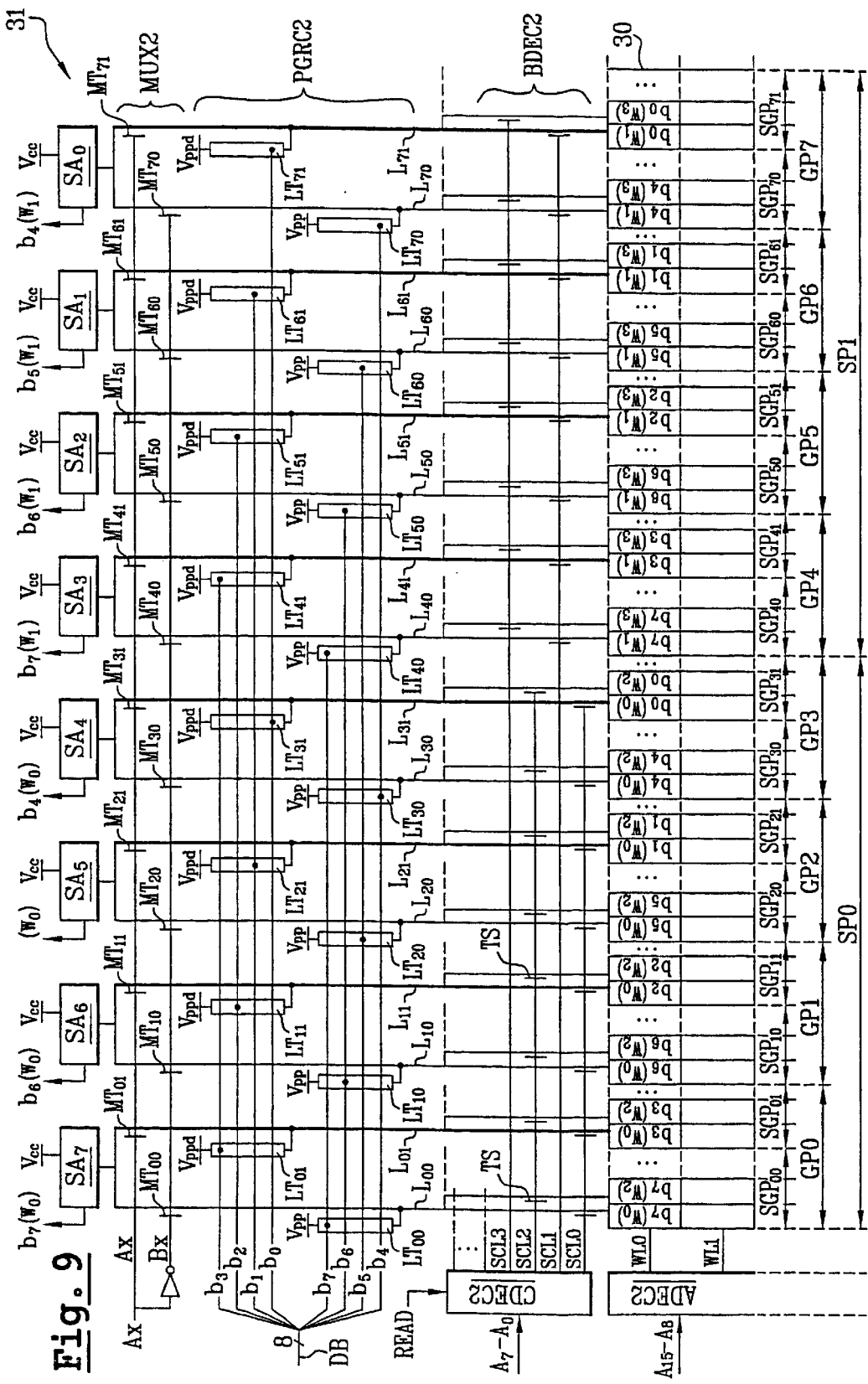

Fig.16

READ-AHEAD ELECTRICALLY ERASABLE AND PROGRAMMABLE SERIAL MEMORY

FIELD OF THE INVENTION

The present invention relates to electrically erasable and programmable memories, especially EEPROM and FLASH memories (FLASH-EEPROM memories). The present invention relates more particularly to a method for the reading of a binary word in a serial input/output memory.

BACKGROUND OF THE INVENTION

In the patent EP 712 133, the problem is explained with serial access integrated memories where it is almost impossible to match the speed at which these memories are read with the rates imposed by the synchronous type serial buses. The time Tr given for the reading of the binary word in a serial access memory extends from the time when the last address bit is received by the memory to the time when the first bit of the word designated by this address is sent by the memory. Since the reading of an address bit is generally done in the middle of a clock period and the sending of a data bit is done at the beginning of a clock period, the time Tr is at least equal to half of a clock period. Indeed, the time Tr is about 1.5 clock periods with the Microwire or I2C type bus (a pause of one clock cycle being allowed between the reception of the last address bit and the sending of the first bit word read). This is about 0.5 clock period with an SPI type bus which is the worst case regarding the requirement of speed in the reading of memories.

During the time Tr, the address received has to be applied to the address decoder of the memory. The word designated by the received address has to be read. The word read has to be loaded into an output register with parallel input and serial output, and a shift signal has to be applied to the output register so that the first bit of the word read is sent.

In practice, the above-mentioned problem is due to the clock frequency of the serial bus constantly increasing in recent years with the development of technology. This frequency was generally about 1 MHZ about ten years ago, or the equivalent of a clock period of about one microsecond, giving a read time Tr of about 0.5 microseconds in the worst case (SPI bus). At present, the frequency is often in the range of 20 MHZ, namely the equivalent of a clock period of 50 nanoseconds and a very short reading time Tr of about 25 nanoseconds. A reading time Tr of this kind exceeds the possibilities of many EEPROM or FLASH memories, despite the providing of fast read circuits.

To address this drawback, the patent EP 712 133 describes a read method including the activation of a read operation before all the address bits are received. Since the address bits are received at the rate of the clock signal, the time gain is equal to the period of the clock signal multiplied by the number N of anticipated address bits. Although this method is satisfactory, it calls for the simultaneous reading of M binary words having the same partial address, M being equal to $2^N$. It is thus necessary, in a read-ahead memory, to provide for a number of read circuits (i.e. sense amplifiers) that is greater than in a conventional memory. For example, it is necessary to provide for sixteen read circuits instead of eight for reading ahead two bytes (N=1, M=2), thirty-two read circuits instead of eight reading ahead four bytes (N=2, M=4), etc.

Read circuits of this kind are complicated and take up a considerable silicon surface area. To be precise, a fast reading circuit takes up a silicon surface area of about a thousand memory cells. Doubling or even quadrupling the number of read circuits has a detrimental effect on the compactness of the memory, and the amount of surface lost amounts to 8,000 to 24,000 memory cells.

SUMMARY OF THE INVENTION

The present invention seeks to overcome the drawbacks discussed above. More particularly, it is a goal of the present invention to provide a read-ahead method that can be implemented without increasing the number of read circuits.

Another goal of the present invention is to provide for EEPROM memory architectures and FLASH memory architectures to implement a method of this kind.

To achieve these goals, the present invention provides for a method for the reading of a binary word in a serial input/output memory, comprising reading data in the memory on reception of a partial read address in which there are N least significant bits lacking to form a complete address. The read step comprises: simultaneously reading the P first bits of M words of the memory having the same partial address; when the received address is complete, selecting the P first bits of the word designated by the complete address and delivering these bits at the serial output of the memory; reading P following bits of the word designated by the complete address during the delivery of P previous bits and delivering the P following bits at the serial output of the memory when the P previous bits are delivered.

According to one embodiment, the reading of P following bits is done like the reading of the P first bits, by the simultaneous reading of P following bits of the M words of the memory having the same partial address and by selecting the P following bits of the word designated by the complete address.

According to one embodiment applicable to a memory in which the memory cells are arranged in word lines and bit lines and the bits lines are arranged in columns, the method comprises providing, in the memory, for the following: an address decoder positioned for the simultaneous selection, after application to the decoder of a complete address, of P bit lines of M different columns and an interconnection bus positioned for the connection of each of the selected P bit lines to a read circuit.

According to one embodiment, the read step is performed by the application, to the decoder, of the partial address received and the scanning, on the least significant address inputs of the decoder, of the $2^N$ possible combinations of the N last address bits.

According to one embodiment applicable to a memory comprising cells arranged in word lines and bit lines, with one word line forming a memory page, the method comprises a preliminary step including the recording of M words of a same partial address in M adjacent sub-pages of a memory page, recording each word in P adjacent groups of cells each comprising K/P adjacent sub-groups of cells, K being the number of bits of each word, and recording j and j+1 ranking bits of a word in adjacent groups of cells and j and j+P ranking bits of a word in adjacent sub-groups of cells in such a way that the words are folded in the sub-pages.

According to one embodiment, the read step comprises a pre-selection step including the simultaneous selection, in read mode, in each group of cells of each sub-page of the memory, of all the cells containing the bits of the M words having the same partial address, and a selection step including the connection to a read circuit of the cells containing one of the P targeted bits of each of the M words.

According to one embodiment, the P first bits of each of the words read simultaneously in the memory are most significant bits.

The present invention also relates to an integrated circuit serial input/output memory able to carry out the following operations upon the reception of a partial read address in which there are N least significant bits lacking to form a complete address: simultaneously reading the P first bits of M words of the memory having the same partial address; when the received address is complete, selecting the P first bits of the word designated by the complete address and delivering these bits at the serial output; reading P following bits of the word designated by the complete address during the delivery of P previous bits and delivering these bits at the serial output when the P previous bits are delivered.

According to one embodiment, the memory comprises a selection circuit for the selection of a group of P bits among M groups of P bits read simultaneously, receiving, at a control input, the N least significant bits of the complete address.

According to one embodiment, the memory comprises memory cells arranged in word lines and bit lines, the bit lines being arranged in columns, an address decoder for the selection of the bit lines and an interconnection bus to connect selected bit lines to read circuits, the address decoder is positioned for the simultaneous selection of P bit lines of M different columns of the same partial address and the interconnection bus is positioned for the connection of each of the P bit lines selected to a read circuit.

According to one embodiment, the memory comprises an address scanning circuit positioned for the scanning, during an operation for reading one word, of the $2^N$ possible combinations of the N least significant bits of an address applied to the address decoder.

According to one embodiment, the memory comprises memory cells arranged in word lines and bit lines, a word line forming a memory page, and bit interlacing means positioned in order to: record M words of the same partial address in M adjacent sub-pages of a memory page; record each word in P adjacent groups of cells each comprising K/P adjacent sub-groups of cells, K being the number of bits of each word; and record j and j+1 ranking bits of a word in adjacent groups of cells, and j and j+P ranking bits of a word in adjacent sub-groups of cells in such a way that the words are folded in the sub-pages.

According to one embodiment, the memory comprises an address decoder comprising bit line selection switches, a circuit for the programming of the memory comprising latch circuits (LT) connected at input to a data bus comprising K wires, the programming circuit comprises M times K latches (LT), the bit lines of one and the same sub-group of cells are connected to a common line via selection switches, each common line is connected to the output of a latch, and the latches connected at output to sub-groups of cells of the same rank belonging to different sub-pages are connected to one and the same wire of the data bus.

According to one embodiment, the address decoder comprises an inhibiting circuit for the inhibition, in read mode, of its N least significant address inputs, to simultaneously select all the bit lines corresponding to the bits of all the words of the memory having the same partial address.

According to one embodiment, the common lines of the sub-groups of cells of one and the same group of cells are connected to one and the same read circuit via a multiplexer circuit positioned for the connection to the read circuit of only one common line at a time, designated by a control signal of the multiplexer circuit.

According to one embodiment, the multiplexer circuit is driven by a scanning circuit positioned for the scanning, during an operation of reading a word, of all the multiplexing values of the control signal, in such a way that the common lines of each sub-group of one and the same group of cells are connected to the read circuit one after the other.

According to one embodiment, the memory comprises a memory block, elements peripheral to the memory block and a bit interlacer placed between the serial input and the input of the memory block and positioned so as to present, at the input of the memory block, composite words comprising M groups of P bits of M different binary words.

According to one embodiment, the memory comprises a volatile type buffer memory whose output is connected to the input of the memory block and recorder for the recording, in the buffer memory, of the data elements that have to be recorded in the memory block and then the recording in the memory block of the data elements previously recorded in the buffer memory.

According to one embodiment, the memory comprises a recorder for the recording in the buffer memory of composite words comprising M groups of P bits of M different binary words received in serial form.

According to one embodiment, P is equal to K/M, K being the number of bits included in the words stored in the memory, M being equal to $2^N$.

According to one embodiment, N is equal to 1 and M is equal to 2.

BRIEF DESCRIPTION OF THE DRAWINGS

These goals, characteristics and advantages as well as others of the present invention will be explained in greater detail in the following description of the read method according to the invention and various embodiments of memories used to implement this method, with reference to the appended figures, of which:

FIGS. 7a to 7L are timing diagrams showing various electrical signals and illustrating the operation of the memory of FIG. 5;

FIG. 9 is a schematic diagram showing the architecture of a FLASH memory block according to the invention;

FIG. 16 is a chart illustrating the interlacing of bits in a memory according to the invention.

DETAILED DESCRIPTION OF THE PREFERRED EMBODIMENTS

1. Description of the read method according to the invention.

Figure 1:
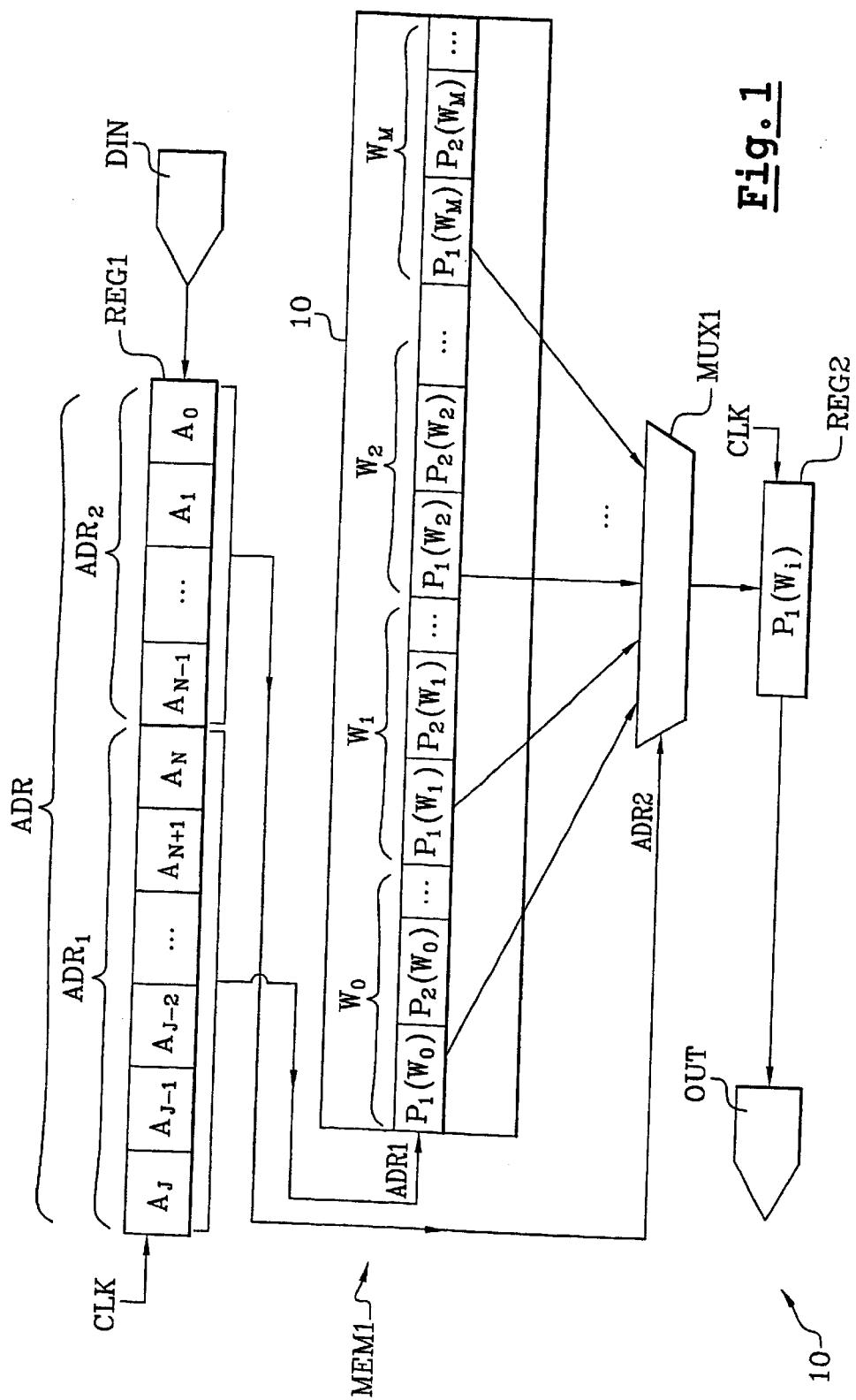
FIG. 1 is a schematic illustration of the read method according to the invention.

FIG. 1 shows a schematic view of a memory MEM1 and illustrates the read method according to the invention. The memory MEM1 comprises a serial input DIN, a shift register REG1, a memory block 10, a selection circuit MUX1 positioned at the output of the memory block 10, a shift register REG1 and a serial output DOUT. Addresses are received at the input DIN and the words read in the memory are sent on the output DOUT. The register REG1 has a serial input connected to the input DIN and a parallel output applied to the memory block 10. The register REG1 comprises a parallel input connected to the output of the memory block 10 via the circuit MUX1 and a serial output connected to the output DOUT of the memory MEM1. The data elements are received or sent bit by bit at the rate of a clock signal CLK, via the registers REG1 and REG2.

The read method according to the invention comprises, in a standard manner, a step of reading M binary words $W_0$, $W_1, \ldots, W_M$ at a point in time where the received address $ADR_1$ is partial and has only most significant bits $A_J, A_{J-1}, A_{J-2}, \ldots, A_{N+1}, A_N$ in which there are N least significant bits $A_{N-1}, A_{N-2}, \ldots, A_0$ lacking to form a complete address ADR. According to the invention, this step includes the reading of the P first bits of the words $W_0, W_1, \ldots, W_M$ having the same partial address ADR1, namely groups of bits $P_1(W_0), P_1(W_1), \ldots, P_1(W_M)$ instead of simultaneously reading all the bits included in each of the M words. When the received address is complete, the group of bits $P_1(W_i)$ of the word $W_i$ designated by the complete address ADR is selected from all the groups of bits read simultaneously, by the application to the selection circuit MUX1 of the N least significant address bits $A_{N-1}, A_{N-2}, \ldots, A_0$ received during the running of the first read operation, forming a selection address $ADR_2$.

While the P bits of the group of bits $P(W_i)$ are delivered one after the other on the output DOUT, the P following bits of the word designated by the complete address are read in the memory. This second read step is preferably performed like the previous one, with the simultaneous reading of the P following bits of the M words of the memory having the same partial address, namely the groups of bits $P_2(W_0)$, $P_2(W_1), \ldots, P_2(W_M)$ and then the selecting of a group of bits $P_2(W_i)$ via the selection address ADR2. The bits of the group $P_2(W_i)$ corresponding to the word $W_i$ designated by the complete address ADR are delivered at the output DOUT when the P first bits are delivered. This read step is repeated until all the bits of the word designated by the complete address are delivered.

Thus, according to the invention, a binary word $W_i$ is read in K/P steps of simultaneous reading of M groups of P bits $P_1(W_i), P_2(W_i), P_3(W_i), \ldots, P_{K/P}(W_i)$, with K designating the number of bits included in each of the words of the memory and K/P being necessarily an integer. The number of bits read simultaneously in the memory at each read step is equal to the product of P by M (M being equal to $2^N$). Preferably, P is equal to K/M, namely $K/2^N$, so that the total number of bits read simultaneously in the memory at each read step is equal to K. In other words, the method according to the invention requires only K read circuits, namely the same number of read circuits as a conventional memory comprising words of K bits and working without any read-ahead operation.

Assuming that the address bits are received at a rate of one bit per clock cycle, which is the case in practice, the time Tr granted for reading the first group of bits $P_1(W_1)$ and delivering the first bits on the output DOUT is equal to:

$$Tr=NT+kT$$

T being the clock period and kT the time granted between the reception of the last address bit $A_0$ and the sending of the first data bit. The parameter k is conventionally equal to 0.5 with a bus SPI (the worst case) and equal to 1.5 with a Microwire or I2C bus. The number N thus represents the number of clock cycles gained for the first read step as compared to a reading without read-ahead operation.

Furthermore, the time Ts granted for reading the following groups of bits $P_2(W_i), P_3(W_i), \ldots, P_{K/P}(W_i)$ is at most equal to:

$$Ts=PT$$

and depends only on the number P of bits of each group.

Since the numbers N and P are parameters of the method of the invention, the time Tr of reading the first group of bits increases as a function of N until the time Ts becomes smaller than the time Tr. On the basis of this value, it is therefore no longer the time Tr available for reading the first group of bits that constitutes the limitation but the time Ts available for reading the following groups of bits.

The method of the invention can be summarized thus, for a given value of N:

$M=2^N$,

K/P is an integer,

P is preferably equal to K/M, giving $K/2^N$ in order to preserve a constant number K of read circuits as compared with a conventional memory comprising K-bit words, the time Tr granted for the reading of the first group of bits is equal to NT+kT, the time Ts granted for the reading of the following groups of bits is equal to PT, namely (K/M)T, the optimum read time Tr is achieved when Ts becomes smaller than Tr, namely:

$$(K/M)T \leq NT+kT$$

It is deduced therefrom that:

$$K/M \leq N+k$$

giving:

$$K/2^N \leq N+k$$

where:

$$K \leq 2^N(N+k)$$

For example, when K=8 bits and k=0.5 the optimum number N is equal to 2, M is equal to 4, P is equal to 2, and the read method of the invention comprises four read cycles of four groups of two bits chosen from four binary words having the same partial address. The time Ts granted for the reading of the first group is 2.5 clock cycles (instead of 0.5 clock cycles without read-ahead operation) and the time granted for the reading of the three following groups of bits is two clock cycles. However, in practice, it may be unnecessary to look for an optimal reading time. The choice of N=1 will in most cases give a sufficient time gain (one clock cycle) to resolve the problem explained in the introduction.

Hereinafter, various embodiments of electrically erasable and programmable memories for implementing this method are described, without losing sight of the fact that the first goal of the present invention is to simplify the architecture of the read-head memories by diminishing the number of read circuits. In other words, the memory architectures according to the invention must not be too complicated as this would mean losing the advantages related to the reduction in the number of read circuits.

With a view to simplicity, the following description of various embodiments of memories according to the invention will be made by choosing N equal to 1 and M equal to 2. A complete address will comprise 16 bits $A_{15}$ to $A_0$, the bit $A_0$ representing the selection address and the bits $A_{15}$-$A_1$ representing the partial address. Preferably, the P first bits of each of the words read simultaneously in the memory will be the most significant bits which are generally sent first on a serial bus.

2. Implementation of the method in an EEPROM memory

A) Architecture of an EEPROM memory array

Figure 2:
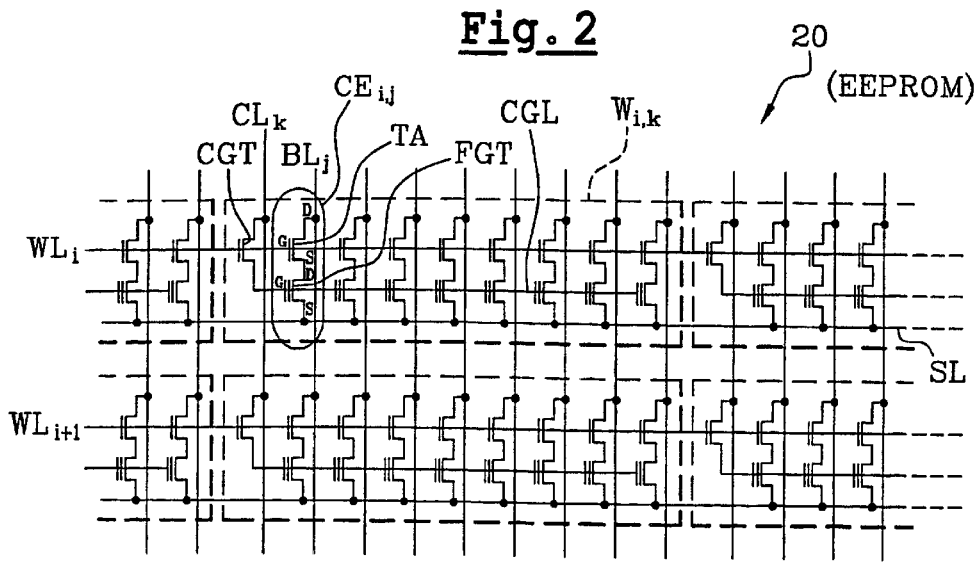
FIG. 2 is a schematic diagram showing the architecture of an EEPROM memory array.

As a reminder, FIG. 2 gives a schematic and partial view of the core of an EEPROM memory or EEPROM memory array 20. The memory array 20 has a plurality of memory cells $CE_{i,j}$ arranged in matrix form and connected to word lines $WL_i$ and bit lines $BL_j$. Each cell $CE_{i,j}$ has a floating-gate transistor FGT and an access transistor TA. The access transistor TA has its gate G connected to a word line $WL_i$, its drain D connected to a bit line $BL_j$, its source S being connected to the drain D of the transistor FGT. The transistor FGT has its gate G connected to a column selection line $CL_k$ via a gate control line CGL and a gate control transistor CGT and its source S connected to a source line SL, the gate of the transistor CGT being connected to the word line $WL_i$. Thus, the memory cells $CE_{i,j}$ of one and the same word line $WL_i$ are arranged in k ranking columns and form words $W_{i,k}$, generally bytes, that can be selected in read mode via the column selection line $CL_k$ and the word selection line $WL_i$ to which they are attached.

In an EEPROM memory array of this kind, an operation for erasing and programming a cell includes the injection or extraction of electrical charges by tunnel effect (Fowler Nordheim effect) in the floating gate of the transistor FGT of the cell. An erased transistor FGT has a positive threshold voltage VT1 and a programmed transistor FGT has a negative threshold voltage VT2. When a read voltage Vread between VT1 and VT2 is applied to its gate, an erased transistor remains off, which conventionally corresponds to a logic "1", and a programmed transistor is on, which conventionally corresponds to a logic "0". The erasure operation is performed by the application of an erasure voltage Vpp of about 12 to 20 volts to the gate G of the transistor FGT while the source line SL is grounded. The programming operation is performed by the application of a programming voltage Vpp to the drain D of the transistor FGT via the access transistor TA while the gate grounded. Since the transfers of charges by tunnel effect are done with a gate current that is practically zero, a large number of EEPROM memory cells can be erased or programmed simultaneously.

B) Architecture of an EEPROM block memory according to the invention

Figure 3:
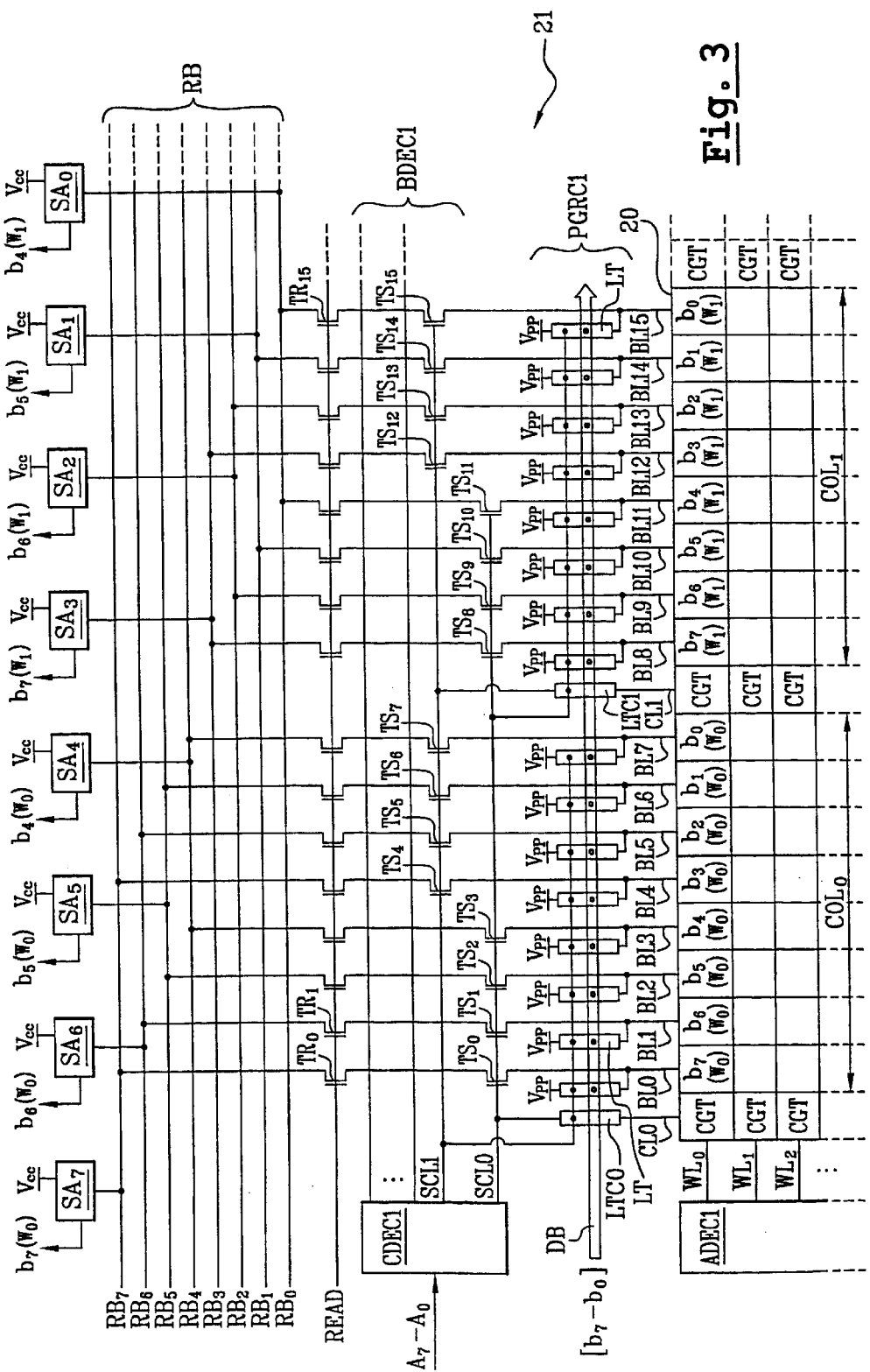
FIG. 3 is a schematic diagram showing the architecture of an EEPROM memory block according to the invention.

FIG. 3 shows a memory block 21 according to the invention comprising an EEPROM memory array 20 similar to the one just described. For the clarity of the figure, a detailed view has been given of only two columns $COL_0$, $COL_1$ of the memory array 20 and four word lines $WL_0$ to $WL_4$. The columns $COL_0$, $COL_1$ comprise eight bit lines each, respectively $BL_0$ to $BL_7$, $BL_8$ to $BL_{13}$. Hereinafter, the description will be limited to the architecture of the memory block 21 in relation to the columns $COL_0$ and $COL_1$, it being understood that this architecture is repeated for the other columns of the memory array. The figure shows the bits $b_0$ to $b_7$ of two binary words $W_0$, $W_1$ having respective coordinates $WL_0/COL_0$ and $WL_0/COL_1$ and addresses $0000_H$ and $0001_H$ (hexadecimal notation). These bits are respectively designated $b_0(W_0)$ to $b_7(W_0)$ and $b_0(W_1)$ to $b_7(W_1)$.

The memory block 21 conventionally has, apart from the memory array 20, a row decoder ADEC1, a column decoder BDEC1, read circuits $SA_0$ to $SA_7$ and a programming circuit PRGC1. The decoder ADEC1 receives the most significant address bit at input, herein eight bits $A_8$ to $A_{15}$ (namely 256 word lines) and, at its output, it selects one of the word lines $WL_i$ designated by the received address, the set of words of a word line forming a page of the memory array 20. The decoder BDEC1 receives least significant address bits, herein eight bits $A_0$ to $A_7$ (namely 256 columns) defining the address of a column, namely the address of a word in a page.

In the memory block 21, a read path and a write path can be distinguished. According to the invention, the read path is used for the delivery, upon the application of a complete address, of the groups of P bits of M binary words having the same partial address, herein four bits of two words. The write path, whose structure shall be recalled further below, is a standard type of operation.

Read path

The column decoder BDEC1 has a decoding block CDEC1 and selection transistors $TS_0$ to $TS_{15}$ driven by the decoding block CDEC1. Each bit line $BL_0$ to $BL_{15}$ is connected to a read circuit $SA_0$ to $SA_7$ via the selection transistor $TS_0$ to $TS_{15}$, a read transistor $TR_0$ to $TR_{15}$ and an interconnection bus RB. The bus RB has eight wires $RB_0$ to $RB_7$, each wire being connected to a read circuit $SA_0$ to $SA_7$. The read transistors $TR_0$ to $TR_{15}$, positioned in series with the transistors $TS_0$ to $TS_{15}$, are driven by a READ signal (gate control), set at 1 in read mode.

According to the invention, the selection transistors $TS_4$ to $TS_7$ of the bit lines $BL_4$ to $BL_7$ of the column $COL_0$ and the selection transistors $TS_{12}$ to $TS_{15}$ of the bit lines $BL_{12}$ to $BL_{15}$ of the column $COL_1$ are driven by the output $SCL_1$ (selection column 1) of the decoding block CDEC1. The selection transistors $TS_0$ to $TS_3$ of the bit lines $BL_0$ to $BL_3$ of the column $COL_0$ and the selection transistors $TS_8$ to $TS_{11}$ of the bit lines $BL_8$ to $BL_{11}$ of the column $COL_1$ are driven by the output $SCL_0$ (column selection 0) of the decoding block CDEC1. Again according to the invention, the j and j+4 (namely j+P) ranking bit lines of each column are connected to one and the same read circuit $SA_j$ via the interconnection bus RB, while the same-ranking bit lines of two words having the same partial address (identical bits $A_{15}$-$A_1$) are connected to different read circuits. In short, the bit lines are herein connected to the read circuits in the manner described in the Table 1 hereinafter, by means of a selection transistor and a read transistor.

TABLE 1

| Bit lines: | Connected to (*): |
|---|---|
| $BL_0$, $BL_4$ (word $W_0$) | $SA_0$ |
| $BL_1$, $BL_5$ (word $W_0$) | $SA_1$ |
| $BL_2$, $BL_6$ (word $W_0$) | $SA_2$ |
| $BL_3$, $BL_7$ (word $W_0$) | $SA_3$ |
| $BL_4$, $BL_8$ (word $W_1$) | $SA_4$ |
| $BL_5$, $BL_9$ (word $W_1$) | $SA_5$ |
| $BL_6$, $BL_{10}$ (word $W_1$) | $SA_6$ |
| $BL_7$, $BL_{11}$ (word $W_1$) | $SA_7$ |

Thus, in read mode (READ=1), the application of an even parity address ($A_0$=0) to the decoder BDEC1 activates the reading of the four most significant bits of two words having the same partial address, and the application of an odd parity address ($A_0$=1) activates the reading of the four least significant bits of two words having the same partial address. For example, the application of the address $0000_H$ to the decoders ADEC1, BDEC1 activates the reading of the bits $b_7$ to $b_4$ of each word $W_0$, $W_1$ that is found at the outputs of the circuits $SA_7$ to $SA_0$ and the application of the address $0001_H$ to the decoders activates the reading of the bits $b_3$ to $b_0$ of each word $W_0$, $W_1$.

In general, an EEPROM memory block according to the invention is thus distinguished from the prior art by the fact that the application of a complete or partial address followed by the read signal READ activates the reading of the groups of P bits of M words having the same partial address.

Write Path

The programming circuit PGRC1 conventionally has a plurality of latches LT powered by the high voltage Vpp during the cell programming periods. The number of latches LT is herein equal to the number of bit lines of the memory array for the simultaneous programming of all the words of a bit line (programming in page mode). Each latch LT has its output connected to a bit line BL and its input connected to a data bus wire DB. The latches LT connected to the bit lines $BL_0$ to $BL_7$ of the column $COL_0$ are activated by the output $SCL_0$ of the decoding block CDEC1, the latches LT connected to the bit lines $BL_8$ to $BL_{15}$ of the column $COL_1$ are activated by the output $SCL_1$ of the decoding block CDEC1, etc. Each latch LT delivers the programming voltage Vpp when it is activated by the decoding block CDEC1 if the bit presented at its input is at 1.

Elements common to write and read operations The programming circuit PRGC1 also has latches LTC that bias the column lines $COL_j$ connected to the drains of the gate control transistors CGT. These latches LTC are used herein in read mode to deliver the voltage Vcc and are used in programming or erasure mode to deliver a zero voltage (programming voltage) or the voltage Vpp (erasure voltage). According to the invention, each latch LTC is activated in read mode by any one of the outputs of the decoding block CDEC1 having the same partial address as the column to which the latch is attached. For example, the latches LTC0, $LTC_1$ of the column $COL_0$, $COL_1$ are activated in read mode by any of the two outputs $SCL_0$, $SCL_1$ of the decoding block CDEC1. However, in programming or erasure mode, each latch LTC is exclusively activated by the outputs $SCL_0$, $SCL_1$ corresponding to the column to which it is attached.

Figure 4:
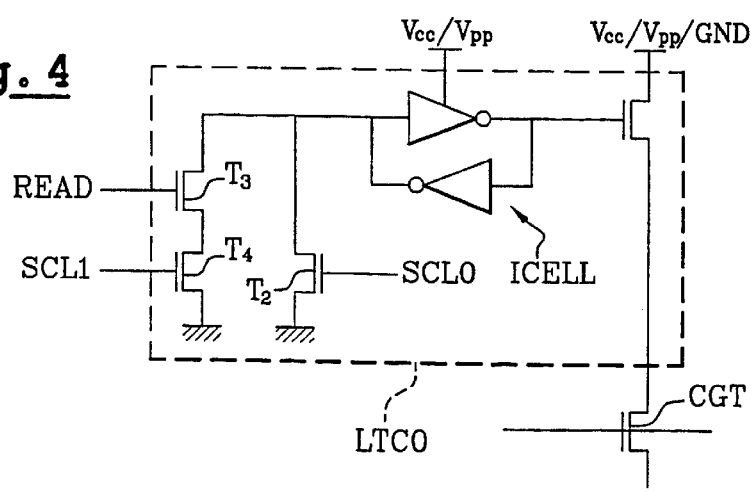
FIG. 4 is an circuit diagram of an element shown in block form in FIG. 3.

An exemplary embodiment of the latch $LTC_0$ is shown schematically in FIG. 4. The latch $LTC_0$ has a memory inverter cell ICELL, constituted by two inverter gates mounted back-to-front, with its output driving the gate of a transistor T1. The transistor T1 has its source connected to the transistor CGT and, at its drain, it receives the voltage Vpp during the cell erasure operations, a zero voltage (ground) during the programming operations or the voltage Vcc during the read operations. The input of the cell ICELL is connected to the ground by two inverter arms, the first arm comprising a transistor T2 driven by the selection signal $SCL_0$ and the second arm comprising, in series, two transistors T3, T4 respectively driven by the signal READ and the selection signal $SCL_1$.

In programming or erasure mode, the signal READ is equal to 0 and only the signal $SCL_0$ can put the input of the gate ICELL at 0 to activate the output of the latch LTC0. The transistor T1 then comes on and connects the transistor CGT to the ground (programming of cells) or to the voltage Vpp (erasure of cells). In read mode (READ=1), the passage to 1 of any of the selection signals $SCL_0$, $SCL_1$ sets the input of the cell ICELL at 0. The transistor T1 comes on and connects the corresponding transistor CGT to the voltage Vcc.

C) Architecture of an EEPROM memory according to the invention

Here above, we have described an EEPROM memory block 21 designed to deliver four most significant bits of the two words having the same partial address upon the application of an even parity address ($A_0$=0) and four least significant bits of these two words upon the application of a corresponding odd parity address ($A_0$=1). As already indicated, this reading mode is a special case of simultaneous reading of groups of P bits in M words having the same partial addresses, when N=1, M=2 and P=4. We shall now show how the properties of the memory block can be used dynamically to implement the method of the invention.

Figure 5:
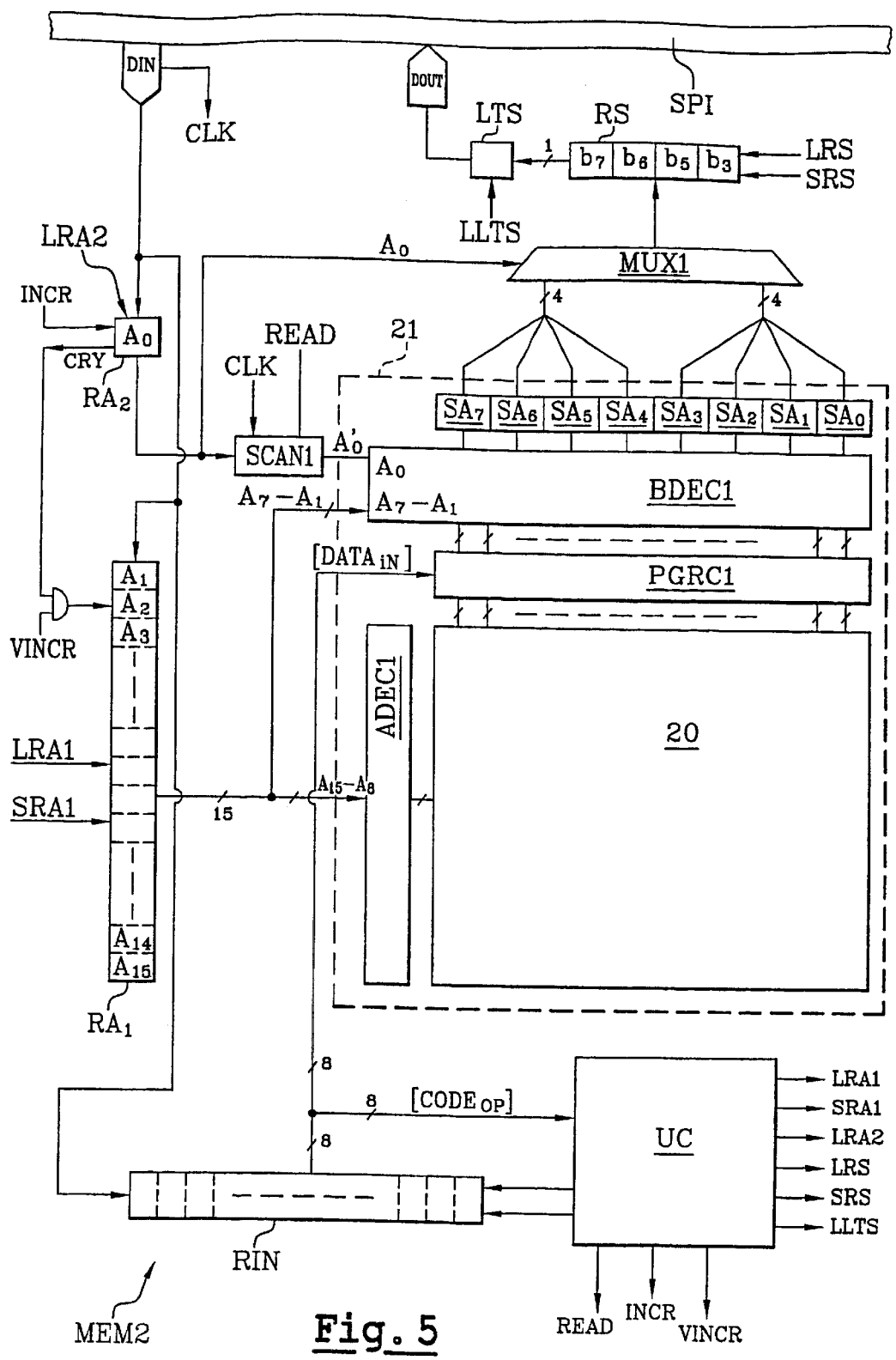
FIG. 5 is a schematic diagram showing the architecture of a serial memory according to the invention made from the memory block of FIG. 3.

FIG. 5 gives a schematic view of a serial memory MEM2 according to the invention comprising a serial input port DIN and a serial output port DOUT herein connected to a bus SPI. The memory MEM2 is obtained from the EEPROM memory block 21 to which various peripherals for the management of input/output data flows as well as the implementation of the method of the invention. These various peripherals include shift registers RA1, RA1, RIN with serial input and parallel output, an address scanning circuit SCAN1, a selection circuit MUX1, an RS shift register with parallel input and serial output and a latch register LTS. The set is driven by a microprocessor-based or wired-logic type of central processing unit UC.

The register RA1, which herein is a 15-bit register, has its serial input connected to the DIN port and its parallel output delivers the address bits $A_{15}$ to $A_1$. The bits $A_{15}$ to $A_8$ are sent on the corresponding inputs of the word line decoder ADEC1 and the bits $A_7$ to $A_1$ are sent on the corresponding inputs of the column decoder BDEC1. The register RA2, which herein has 1 bit, has its serial input connected to the port DIN and its output delivers the address bit $A_0$. The bit $A_0$ is applied to the control input of the circuit MUX1. The bit $A_0$ is also applied to the input of the circuit SCAN1 whose output is connected to the address input $A_0$ of the column decoder BDEC1. The 8-bit register RIN has its serial input connected to the DIN port and its parallel output connected to the input of the central processing unit UC and to the input of the programming circuit PGRC1 (memory block 21). The selection circuit MUX1 is connected at input to the outputs of the read circuits $SA_0$ to $SA_7$ (memory block 21) and is connected at output to the parallel input of the shift register RS. The serial output of the register RS is applied to the input of the register LTS whose output is connected to the port DOUT.

Figure 6:
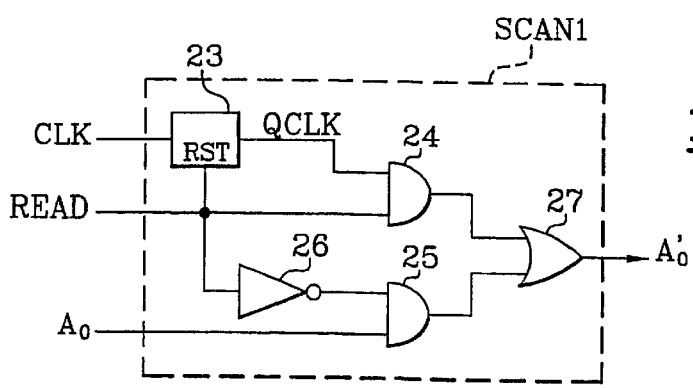
FIG. 6 is the electrical diagram of an element shown in block form in FIG. 5.

The circuit SCAN1, shown in greater detail in FIG. 6, includes a frequency divider 23 receiving, at input, the clock signal CLK from the bus SPI as well as two AND gates 24, 25, an inverter gate 26 and an OR gate 27. The divider 23, which is herein a divider-by-4 (because P=4), receives the signal READ at its resetting input RST and delivers a signal QCLK whose frequency is four times slower than that of the clock signal CLK. The signal QCLK is applied to one input of the gate 24 whose other input receives the signal READ. The gate 25 receives the least significant address bit $A_0$ and the inverter signal/READ delivered by the gate 26 at its inputs. The gate 27 receives, at input, the outputs of the gates 24, 25 and delivers a bit $A_0'$.

At the output of the circuit SCAN1, the bit $A_0'$ copies the least significant bit $A_0$ when the signal READ is at 0 (gate 24 inhibited, circuit SCAN1 transparent) or copies the signal QCLK when the signal READ is at 1 (gate 25 inhibited, circuit SCAN1 active). The signal QCLK is at 0 during the first four clock cycles after the passage to 1 of the signal READ and then passes to 1 for the next four clock cycles, etc.

We shall refer again to FIG. 5. The general operation of the memory MEM2 with respect to the management of data flows at input and the performance of write operations is a standard operation and shall not be described in detail. The operation codes [$CODE_{OP}$] of the instructions to be performed are received bit by bit in the register RIN by successive loading and shift operations of the register and then sent to the central processing unit UC for decoding. The data elements received [$DATA_{IN}$] to be recorded in the memory block are also received by the register RIN and applied thereafter to the input of the programming circuit PGRC1. The word recording or reading addresses are received in the registers RA1 and RA2.

The operation of the memory MEM2 in read mode is illustrated by FIGS. 7A to 7L which respectively show the following signals delivered by the central processing unit UC:

CLK: synchronization clock signal,

DIN: data (address bits) received on the port DIN,

LRA1: loading of a bit in the register RA1,

SRA1: shifting by one bit of the register RA1,

READ: read signal,

LRA2: loading of a bit in the register RA2, $A_0'$: signal delivered by the circuit SCAN1, INCR: incrementation of the register RA2, LRS: loading in parallel of the register RS, SRS: shifting by one bit of the register RS, LLTS: loading of a bit in the register LTS, DOUT: data (bits of one word) sent on the DIN port.

These figures illustrate the process of reading after reception of the operation code [$CODE_{READ}$] of the instruction for the reading and reception of the first memory bits $A_{15}$ to $A_4$. The reception of these address bits, illustrated by FIGS. 7A to 7D, is done by steps of loading (LRA1) the register RA1 in the middle of the clock and shift cycle (SRA1) of the register RA1 at the end of the clock period. The last but one address bit $A_1$ is recorded in the register RA1 and the last bit $A_0$ is recorded in the register RA2 (signal LRA2, FIG. 7F).

The signal READ (FIG. 7E) is sent substantially when the bit A1 is loaded into the register RA1. At this time, the register RA1 is full and contains the partial address $A_{15}$-$A_1$. The passage to 1 of the signal READ activates the circuit SCAN1 which delivers a bit $A_0'$ equal to 0 for a duration of four clock cycles CLK (FIG. 7G). The memory block 21 thus receives an even parity address, the input $A_0$ of the decoding block being tied at 0. The memory block delivers the four most significant bits $b_7$ to $b_4$ of each word $W_0$, $W_1$ of the same partial address that are at the outputs of the circuits $SA_7$ to $SA_0$ (FIG. 5). When the bit $A_0$ is received and recorded in the register RA2 (FIG. 7F), the bit $A_0$ is retrieved at the control input of the circuit MUX1 for selection of the group of bits $b_7$-$b_4$ of the word designated by the complete address. Substantially at the same time, the loading signal LRS is applied to the register RS (FIG. 7J). This register is therefore loaded with the selected group of bits $b_7$-$b_4$ and the bit $b_7$ is delivered at its output. At the trailing edge of the clock cycle, namely 0.5 clock cycles after the reception of the last address bit $A_0$, the signal LLTS for loading the output register LTS is sent (FIG. 7K) and the bit $b_7$ is sent on the port DOUT.

The time $\Delta t$ gained here for the reading of the first group of bits $b_7$-$b_4$ is equal to one clock cycle (N=1) and is added to the half clock cycle between the reception of the last address bit and the sending of the first data bit. This result is achieved with only eight read circuits $SA_0$-$SA_7$ against sixteen in a standard read-ahead memory, with an output register RS comprising only four bits.

After the sending of the first bit $b_7$, the following bits $b_6$ to $b_4$ are sent by successive shifts of the register RS and operations of loading the register LTS (FIGS. 7J, 7K). At the fifth clock cycle following the activation of the read-ahead step, namely during the sending of the bit $b_5$, the bit $A_0'$ at output of the scanning circuit SCAN automatically goes to 1 (FIG. 7G) and the read process is again engaged for the reading of the following bits, here the least significant bits $b_3$ to $b_0$ of each of the words $W_0$, $W_1$. When the bit $b_4$ is sent, the signal LRS for loading the register RS is again sent on the trailing edge of the clock signal and the bits $b_3$ to $b_0$ are sent on the port DOUT in the same way as the previous ones.

Optionally, the memory MEM1 may work in sequential read mode and, after the reading of the word designated by the address received, it may continue to read a plurality of words whose number is indicated in the read instruction. In this case, as shown in FIGS. 5 and 7H, an incrementation signal INCR is applied to the register RA2 during the sending of the least significant bits of the previous word. The overflow signal CRY of the register RA2 is applied to the register RA1 as an incremental signal via an AND gate receiving, at its other input, an enabling signal VINCR delivered by the central processing unit UC. The signal VINCR must be at 1 so that the sequential read mode is enabled.

3. Implementation of the method in a FLASH Memory

A) Introduction i) Architecture of a FLASH memory array

Figure 8:
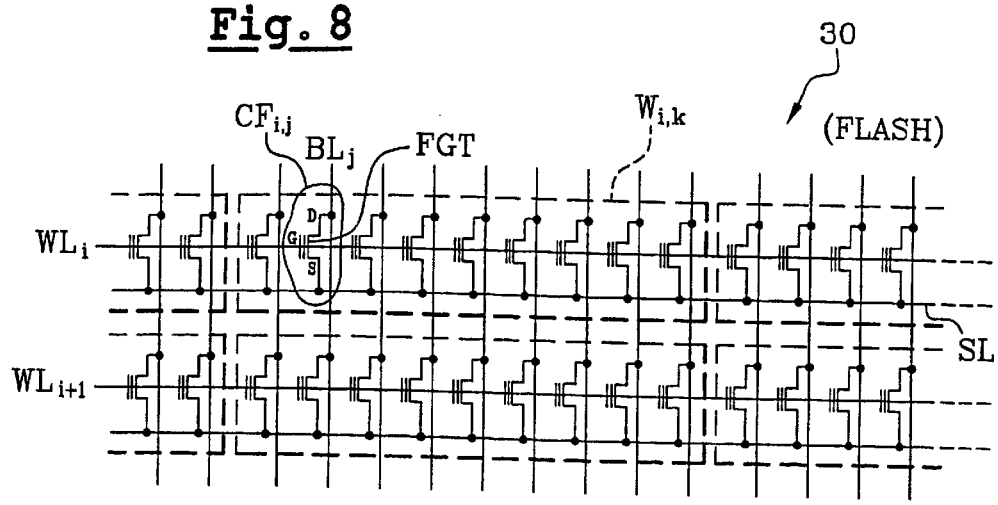
FIG. 8 is a schematic diagram showing the architecture of a FLASH memory array.

As a reminder, FIG. 8 gives a schematic view of the core of a FLASH memory or FLASH memory array 30. The memory array 30 has a plurality of memory cells, respectively $CE_{i,j}$, $CF_{i,j}$ arranged in matrix form and connected to word lines $WL_i$ and bit lines $BL_j$. The cells $CF_{i,j}$ of the memory array FLASH have a simpler structure than EEPROM memory cells and comprise only one floating gate transistor FGT. The transistor FGT has its gate G connected to a word line $WL_i$, its drain D connected to a bit line $BL_j$ and its source S connected to a source line SL. The arrangement of the cells of one and the same word may be gradual or interlaced so that a word $W_{i,k}$ attached to a rank i line and a rank k column may comprise eight cells positioned side by side as shown in FIG. 8 or may, in the case of an interlacing, comprise non-adjacent cells. In the prior art, the physically adjacent cells are generally same-ranking cells of the words of one and the same word line.

In a FLASH memory array of this kind, a cell erasure operation includes the extraction by tunnel effect of electrical charges trapped in the floating gate while a programming operation includes the injection of charges into the floating gate by the effect known as hot electron injection. An erased FGT transistor has a positive threshold voltage VT1 with a low value and a programmed transistor has a threshold voltage VT2 higher than VT1. When a read voltage Vread between VT1 and VT2 is applied to its gate, an erased transistor is on, which corresponds by convention to a logic "1" and a programmed transistor remains off, which corresponds by convention to a logic "0".

Owing to their simplicity, the FLASH memories have the advantage of high compactness in terms of silicon surface area occupied and thus have a constant silicon surface area and a storage capacity appreciably greater than that of the EEPROM memories, for a lower cost price.

By contrast, the FLASH memories offer more limited possibilities of programming than do EEPROM memories, especially as regards the possibility of simultaneously recording several words. Indeed, the operational programming of a FLASH cell by hot electron injection is done with a non-negligible level of current by applying a drain voltage Vppd of about 6 V and a gate voltage Vppg of about 12 V to a transistor FGT of the cell, the transistor FGT being in the on state and strongly biased during the operation.

Thus, it proves to be impossible to simultaneously program a large number of FLASH cells because of the substantial current collected in the source lines SL, which is capable of destroying the metal tracks connecting the transistors of the memory and/or connections between tracks of different levels. In practice, the number of cells that can be simultaneously programmed is generally limited to eight so that a FLASH memory cannot be used for the simultaneous recording of several words and always works in the "word-by-word" programming mode.

ii) Implementing the Method of the Invention

The ideas and principles implemented in the EEPROM memory block described here above can be transposed to a FLASH memory architecture to obtain a simultaneous reading of groups of P bits of M binary words. However, a transposition of this kind leads to the making of a complex FLASH memory (provided especially with a reading bus) and leads to a loss of the advantages offered by this type of memory in terms of compactness.

Here, the idea of the present invention is to take advantage of the possibility of the interlacing of bits offered by FLASH memories and to provide for an interlacing that achieves the simultaneous reading of the groups of P bits of M binary words without complicating the architecture of the memory in a way that makes it defective. An interlacing of bits such as this must be done at the stage when the binary words are recorded in the FLASH memory whereas it was done when the binary words were read in the EEPROM memory described further above.

The present invention herein provides two approaches, each having advantages depending on the application in view. The first approach includes modifying the write path within a FLASH memory block to obtain the desired interlacing at the time of the recording of the binary word. An embodiment in accordance with this approach shall be described hereinafter in Section III-2. The second approach includes providing for external means positioned on the data path leading to the input of the memory providing for the interlacing of the binary words before they are introduced into the memory. One embodiment in accordance with this approach shall be described further below in Section III-3.

B) First embodiment:

i) Architecture of a FLASH memory block according to the invention

FIG. 9 shows the architecture of a FLASH memory block 31 according to the invention comprising a memory array 30 of the type described here above, a word line decoder ADEC2, a bit line decoder BDEC2 comprising a decoding block CDEC2 and selection transistors TS, a programming circuit PGRC2, a selection circuit MUX2 and eight read circuits $SA_0$–$SA_7$.

Figure 16:
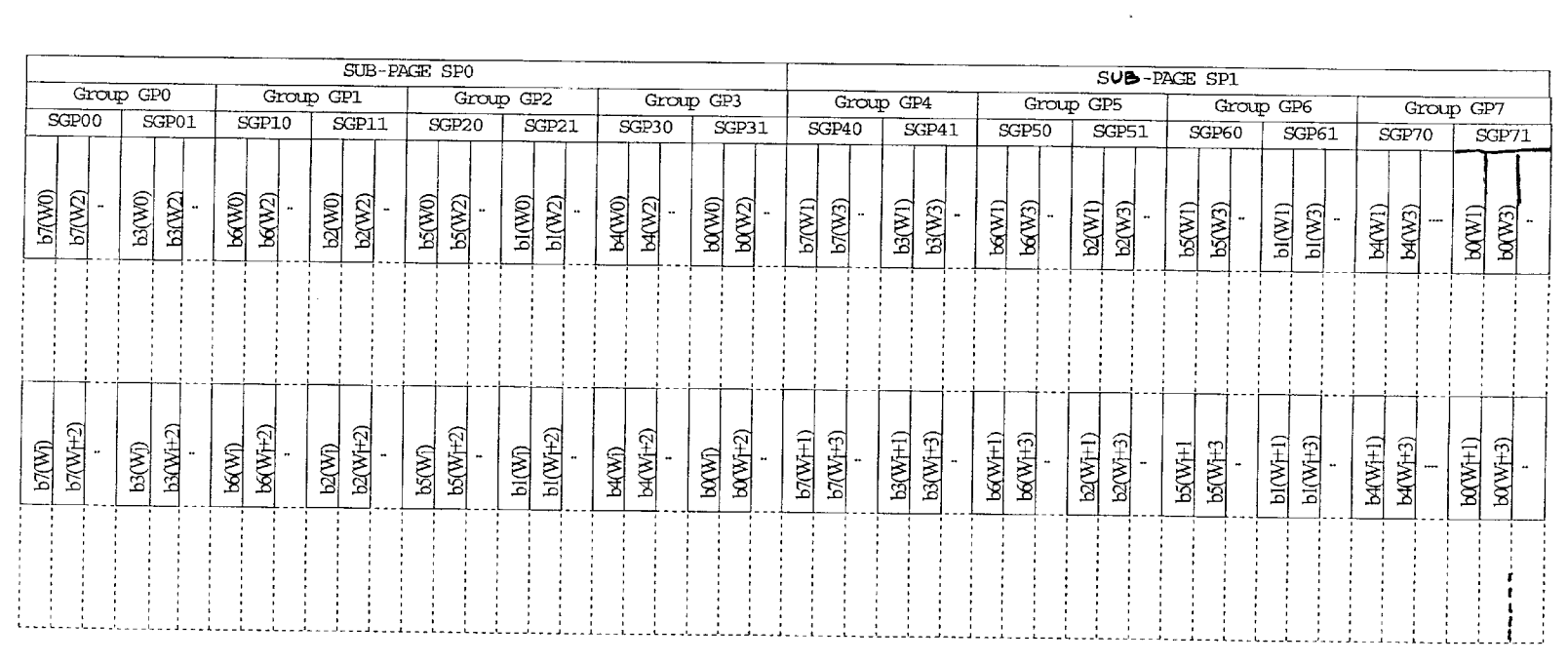

The memory array 30 has an interlacing of bits as illustrated by the chart in FIG. 16, forming an integral part of the description. This table describes an interlacing according to the invention when N=1, M=2, P=4, K=8. The binary words $W_0$, $W_1$, $W_2$, $W_3$ mentioned as examples have addresses $0000_H$, $0001_H$, $0002_H$ and $0003_H$ respectively. The words $W_0$, $W_1$ on the one hand and the words $W_2$, $W_3$ on the other have the same partial address. The interlacing of the bits in the memory array 30 is done according to the following rules:

1) Each memory page namely each word line $WL_0$, $WL_1$, $WL_2$, $WL_3$ is divided into M sub-pages, herein two sub-pages $SP_0$, $SP_1$.
2) The words having the same partial address are arranged in adjacent sub-pages. For example the words $W_0$, $W_2$ are arranged in the sub-page $SP_0$ and the words $W_1$, $W_3$ are arranged in the sub-pages $SP_1$.
3) Each sub-page has P groups of cells namely herein four groups $GP_0$ to $GP_3$ for the sub-page $SP_0$ and four groups $GP_4$ to $GP_7$ for the sub-page $SP_1$.
4) Each group is divided into K/P sub-groups of cells, in this case two sub-groups (K=8, P=4). For example, the group $GP_0$ has two sub-groups $SGP_{00}$, $SGP_{01}$, the group $GP_1$ has two sub-groups $SGP_{10}$, $SGP_{11}$, etc.
5) The j and j+1 ranking bits of one and the same word are stored in adjacent groups of one and the same sub-page. For example, the bits $b_7$, $b_6$, $b_5$, $b_4$ of the word $W_0$ are stored in the groups $GP_0$, $GP_1$, $GP_2$, $GP_3$ of the sub-page $SP_0$ and the bits $b_7$ to $b_4$ of the word $W_1$ are stored in the groups $GP_4$ to $GP_7$ of the sub-page $SP_1$.
6) The j and j+P ranking bits, herein j and j+4 ranking bits, are stored in adjacent sub-groups of one and the same group. For example, the bits $b_7$ of the words $W_0$, $W_2$, . . . are arranged in the sub-group $SGP_{00}$ of the group $GP_0$ and the bits $b_3$ of the words $W_0$, $W_2$, . . . are arranged in the sub-group $SGP_{01}$.
7) Finally, each sub-group has same-ranking bits belonging to words with addresses showing jumps with a value M, herein jumps with a value 2. For example, the sub-group $SGP_{00}$ comprises the bit $b_7$ of each of the words $W_0$ and $W_2$.

In other words, the binary words having the same partial address are recorded in adjacent sub-pages of one and the same page and are "folded" in each sub-page into P groups of bits, where the folding includes planning for K/P sub-groups. By assigning one and only one read circuit to each group of bits, as will be seen here below, this interlacing is used to limit the number of read circuits.

Such an interlacing of bits is obtained herein by planning, in the memory block 31, for a specific write path that shall be described further below. Furthermore, the memory block 31 comprises a read path, in concordance with the interlacing of bits, designed for the delivery, on the application of a complete address, of groups of P bits of M binary words having the same partial address, herein groups of four bits.

Read Path

The memory cells of each sub-group of bits $SGP_{00}$, $SGP_{01}$, $SGP_{10}$, $SGP_{11}$, $SGP_{20}$, . . . , $SGP_{71}$ have their bit lines connected to a common line respectively $L_{00}$, $L_{01}$, $L_{10}$, $L_{11}, L_{20}, \ldots, L_{71}$ via a selection transistor TS of the decoder BDEC2. The lines $L_{00}$ to $L_{71}$ are connected to one and the same read circuit via the selection circuit MUX2. This circuit MUX2 comprises transistors $MT_{01}$, $MT_{11}$, $MT_{21}, \ldots, MT_{71}$ driven by a signal AX and transistors $MT_{00}, MT_{01}, MT_{10}, MT_{20}, MT_{70}$ driven by a signal BX that is the reverse of the signal AX, delivered by an inverter gate. The common lines attached to sub-groups of cells of one and the same group, herein the pairs of lines $L_{00}/L_{01}$, $L_{10}/L_{11}$, $L_{70}/L_{71}$, are connected to one and the same read circuit respectively $SA_7, SA_6, \ldots, SA_0$, via transistors of the circuit MUX2 working in phase opposition. Thus, the lines $L_{00}/L_{01}$ are connected to the read circuit $A_7$ by the transistors $MT_{00}/MT_{01}$, the lines $L_{10}/L_{11}$ are connected to the read circuit $A_6$ by the transistors $MT_{10}/MT_{11}$, etc.

The connections between the outputs $SCL_0, SCL_1, \ldots$ of the decoding block CDEC2 and the selection transistors TS are made so that the application of a given address to the decoding block CDEC2 leads to the selection of all the bit lines of the word designated by this address, the separation between the most significant bits and the least significant bits being done by the transistors MT of the circuit MUX2 according to the value of the signal AX.

Figure 10:
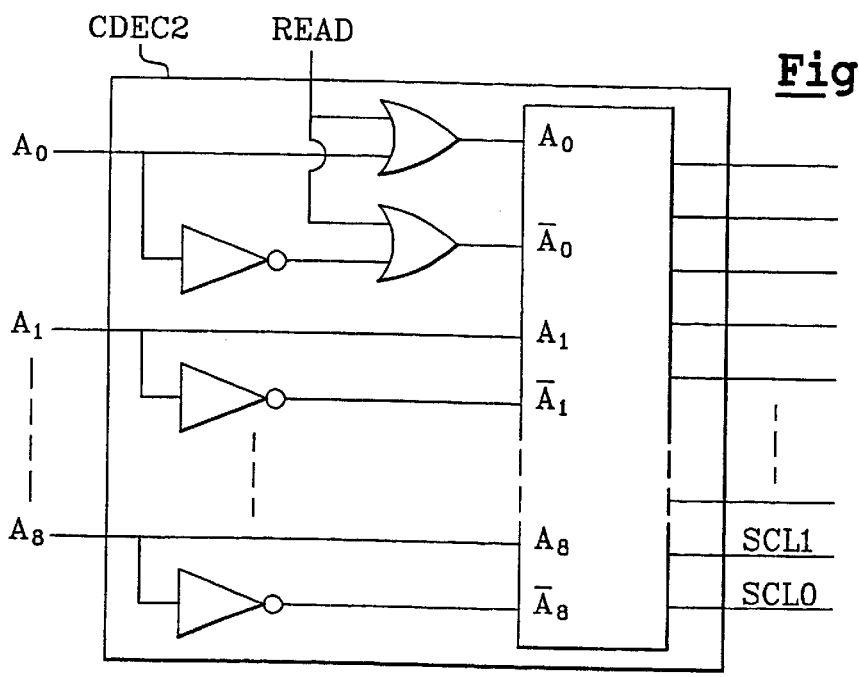
FIG. 10 is a circuit diagram showing an element that has been shown in the form of a block in FIG. 9.

Furthermore, so that two four-bit groups of two different words may be selected simultaneously, the decoding block CDEC2 is positioned to activate two outputs of the same partial address in read mode. For example, the outputs $SCL_0$ and $SCL_1$ are simultaneously activated after the application, to the decoding blocks CDEC2, of the address $0000^H$ or the address $0001^H$. FIG. 10 shows how the simultaneous activation of all the outputs of the decoding block CDEC2 having the same partial address may be obtained. It can be seen that each principal input $A_0, A_1, \ldots$, of the decoding block CDEC2 comprises a complementary input $/A_0, /A_1, \ldots$ receiving the reverse of the address bit applied to the main input. This feature is a standard one in a decoder. According to the invention, the inputs $A_0$ and $/A_0$ are set at "1" in read mode by the signal READ, via two OR gates receiving at input the signal READ and the bit $A_0$ or $/A_0$. Thus, when an address is applied to the decoding block CDEC2 and the signal READ is at 1, the two outputs of the decoding block CDEC2 with the same partial address are simultaneously activated. These two outputs are, for example, the outputs $SCL_0$, $SCL_1$ in FIG. 9.

Thus, referring again to FIG. 9, it can be seen that the application of an address $A_{15}$-$A_0$ comprising eight bits $A_{15}$-$A_8$ applied to the decoder ADEC2 and eight bits $A_7$-$A_0$ applied to the decoding block CDEC2 leads to the selection of all the bit lines of the words having the same partial address $A_{15}$-$A_1$, the separation between the most significant bits and the least significant bits of each of the words being provided at the input of the read circuits by the transistors MT of the circuit MUX2. In practice, the application of a partial address $A_{15}$-$A_1$ is enough to obtain this result since the least significant bit $A_0$ is inhibited by the signal READ (FIG. 10). For example, the application of a partial address $A_{15}$-$A_1$ having all its bits at 0 activates the simultaneous selection of the words $W_0$ and $W_1$ with respective addresses $0000_H$ and $0001_H$. The read circuits $SA_7$-$SA_0$ deliver the bits $b_7(W_0)$-$b_4(W_0)$ $b_7(W_1)$-$b_4(W_1)$ if the signal AX is at 0 or deliver the bits $b_3(W_0)$-$b_0(W_0)$ $b_3(W_1)$-$b_0(W_i)$ if AX is at 1.

Write Path

The programming circuit PGRC2 has as many latch circuits as there are sub-groups of cells, in this case sixteen latches $LT_{00}, LT_{01}, LT_{10}, LT_{11}, \ldots, LT_{71}$. Each latch is connected at output to a common line $L_{00}, L_{01}, L_{10}, L_{11}, \ldots, L_{71}$ and at input to a wire of the data bus DB. This wire of the data bus is the one whose rank corresponds to the rank of the bits stored in the sub-group of cells connected to the common line. For example, the latch $LT_{00}$ is connected at input to the wire $b_7$ of the bus DB (wire conveying bits of a rank 7) for its output is connected to a common line $LT_{00}$ of the sub-group $SGP_{00}$ comprising the bits $b_7$ of the even parity address words. Furthermore, the latches LT assigned to sub-groups of the same rank in each sub-page are connected to the same wire of the data bus DB. For example, the latches $LT_{00}$ and $LT_{40}$ are both connected to the wire $b_7$ of the bus DB because their outputs are respectively connected to the common lines $L_{00}$ and $L_{40}$ of the cells of the sub-groups $SGP_{00}$ and $SGP_{40}$ containing bits $b_7$.

During a cell programming operation, which is always preceded by the erasure of the page concerned or the simultaneous erasure of several pages, all the latches LT are biased by the high drain voltage Vppd and at input they receive the bits $b_7$-$b_0$ to be programmed. The selection of the eight memory cells receiving the voltage Vppd is done by the selection transistors TS of the decoder BDEC2 which are laid out between the programming circuit PGRC2 and the memory array 30. It may be noted that this positioning of the programming circuit PGRC2 upline with respect to the selection transistors TS of the decoder BDEC2 is due to the fact that the simultaneous programming of several words cannot be envisaged in a FLASH memory for the reasons mentioned further above. The assigning of a latch LT to each bit line, as is the case in the EEPROM memory described further above, therefore cannot be envisaged herein.

ii) Architecture of a serial memory according to the invention

Figure 11:
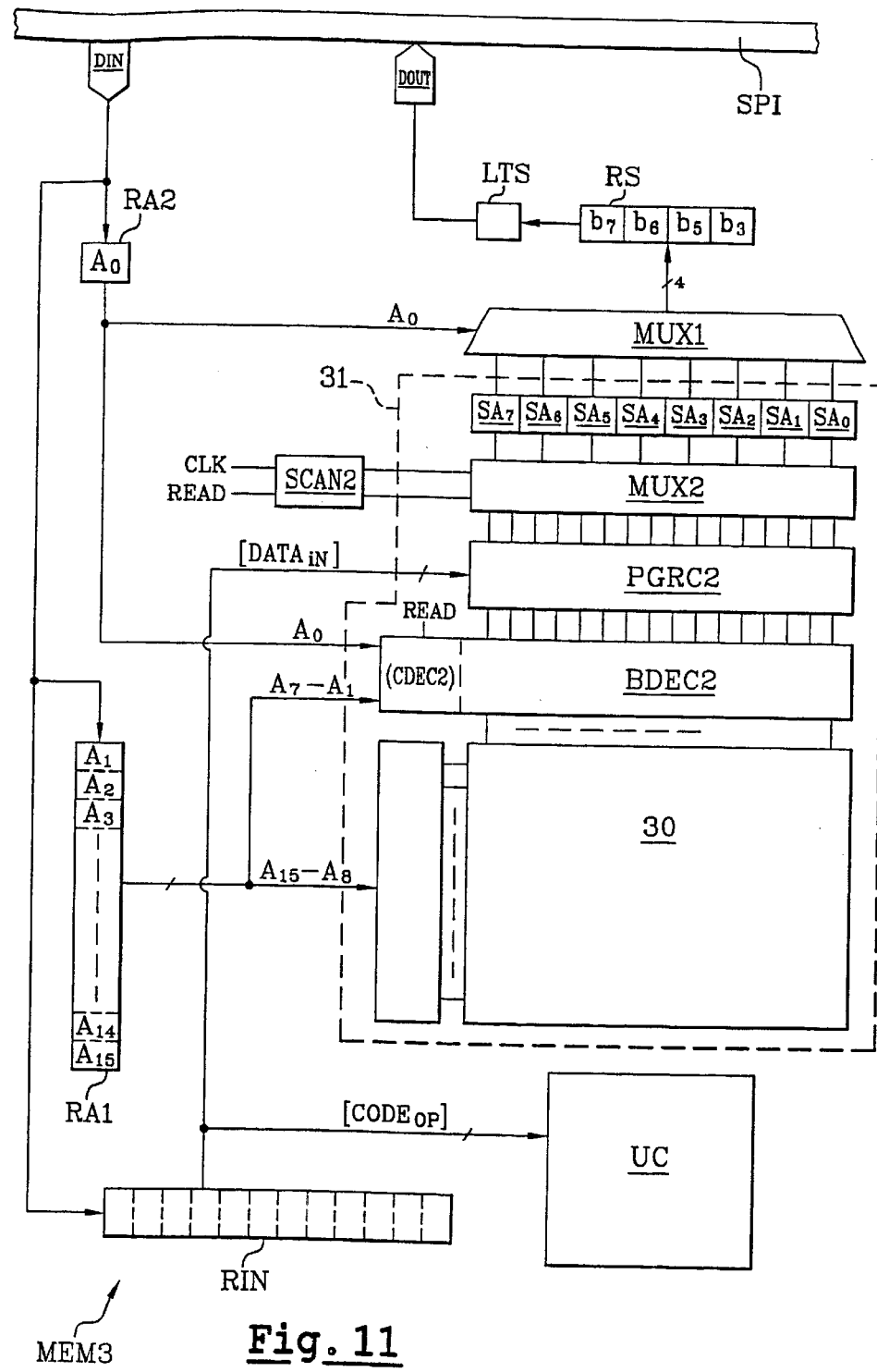
FIG. 11 is a schematic diagram showing the architecture of a serial memory according to the invention made out of the memory block of FIG. 9.

FIG. 11 shows the architecture of a memory MEM3 according to the invention made from the memory block 31 described here above and various peripherals. The architecture of the memory MEM3 is simultaneously the same as that of the memory MEM2. There are the ports DIN, DOUT, the input registers RA1, RA2 (for the addresses) and RIN (for the data and the operation codes), the selection circuit MUX1 connected to the output of the read circuits $SA_7$-$SA_1$, the output registers RS, LS and the central processing unit UC.

The bit $A_0$ delivered by the register RA2 is applied herein directly to the decoder BDEC2, the circuit SCAN1 being eliminated. The circuit SCAN1 is replaced by a scanning circuit SCAN2 which delivers the signal AX driving the selection circuit MUX2 of the memory block 31.

Figure 12:
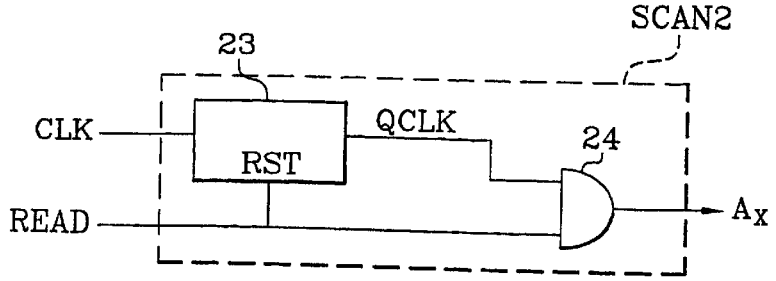
FIG. 12 is a logic diagram of an element shown in block form in FIG. 11.

The circuit SCAN2 shown in FIG. 12 comprises the divider 23 described further above, again a divider-by-4, whose output delivers the signal QCLK. The signal QCLK is sent to the output of the circuit SCAN2 by means of a switch transistor SWT driven by the signal READ. Thus, the signal AX at output of the circuit SCAN2 copies the signal QCLK during the read periods (READ=1). Outside the read periods, the transistor SWT it closed and the signal AX is at high impedance, the selection transistors MT of the circuit MUX2 remaining thus blocked.

The operation of the memory MEM3 is similar to that of the memory MEM2. Reference will be made to the explanations given further above with reference to FIGS. 7A to 7L, assuming that the signal $A_0'$ is herein the signal AX.

3) Second Embodiment

Figure 13:
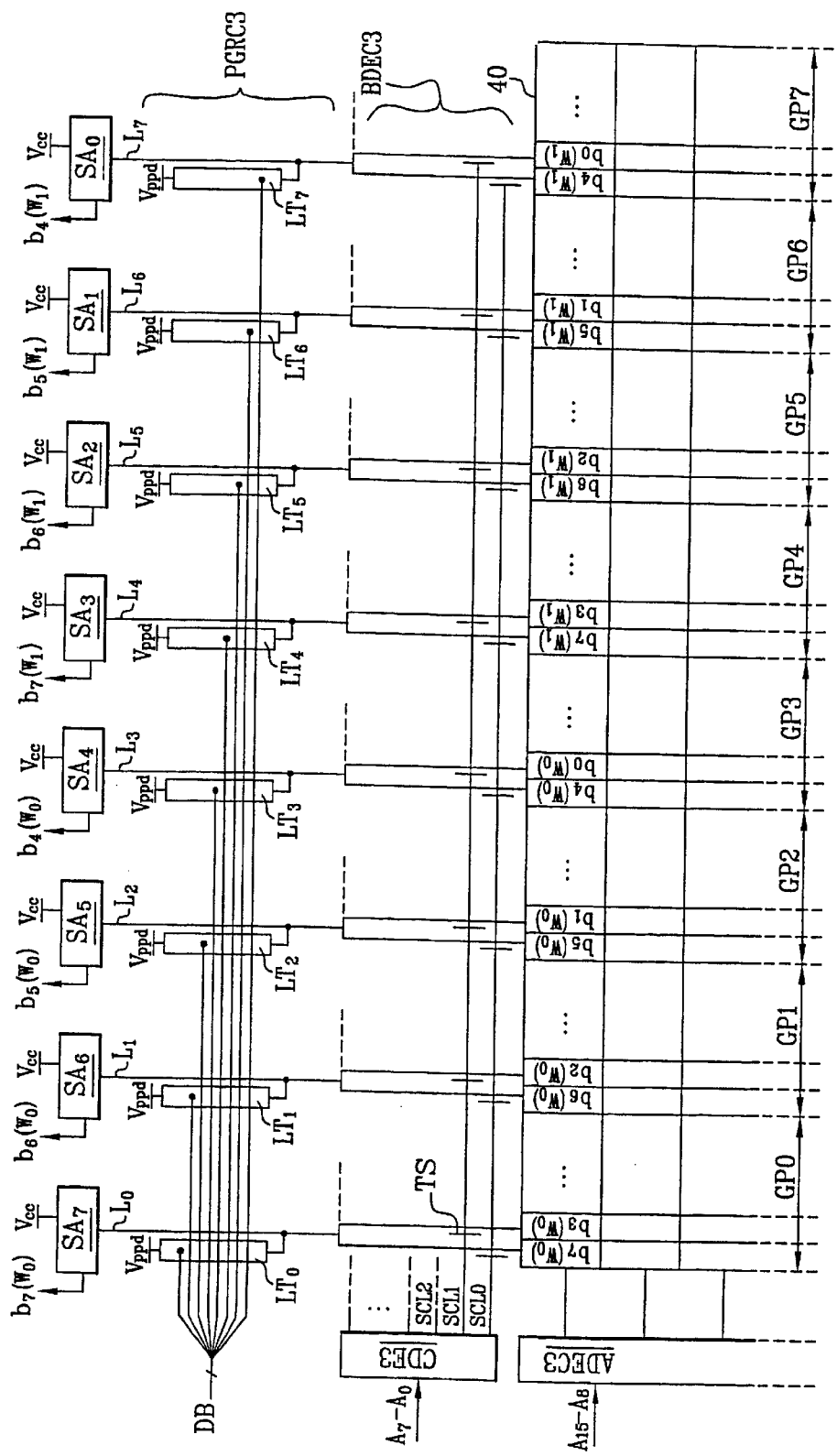
FIG. 13 is a schematic diagram showing the architecture of a standard FLASH memory block comprising an interlacing of bits according to the invention.

A) Architecture of a FLASH memory block comprising an interlacing of bits according to the invention FIG. 13 shows a FLASH memory block 41 which, like the previous one, has a memory array 40, a word line decoder ADEC2, a bit line decoder BDEC3, a programming circuit PGRC3 with only eight latches $LT_0$ to $LT_7$ connected at input to a data bus DB and eight read circuits $SA_0$ to $SA_7$. The memory array 40 is identical to the memory array 30 described here above, the words being stored according to the interlacing described in the chart of FIG. 16.

The memory array 41 is distinguished from the memory array 31 of FIG. 9 by a simplified architecture which is actually that of a standard FLASH memory block used in the prior art to store words in eight groups of cells ranked in rising order, each with same-ranking bits. All the bit lines of the cells of one and the same group $GP_0, GP_1, \ldots, GP_7$ are connected to a common line $L_0, L_1, \ldots, L_7$ via selection transistors TS of the decoder BDEC3 and each common line $L_0$ to $L_7$ is connected to a read circuit $SA_0$ to $SA_7$ in the multiplier circuit MUX2 described further above. Consequently, two cells belonging to two sub-groups SGP of one and the same group GP are not differentiated from each other and are connected to the same read circuit SA. Herein the selection of the most significant cells or least significant cells present within the groups (see Table 2) is done exclusively by the transistors TS of the decoder BDEC3, each output $SCL_0, SCL_1, \ldots$ of the decoding block CDEC3 driving only eight selection transistors TS. The write path of the memory block 41 is also standard, each latch $LT_0, LT_1, \ldots, LT_8$ being connected at input to a wire of the data bus DB and at output to one of the control lines $L_0, L_1, \ldots, L_8$.

Ultimately, the architecture of the memory block 41 cannot be used to obtain the interlacing of the words according to the invention at the stage of their recording. This interlacing is obtained here by an external means that sends already interlaced composite words of the following type on the data bus DB of the programming circuit:

$b_7(W_1)-b_4(W_j)-b_7(W_{j+1})-b_4(W_{j+1})$.

or of the following type:

$b_3(W_j)-b_0(W_j)b_3(W_{j+1})-b_0(W_{j+1})$.

Thus, the original binary words are split up into groups of P bits in composite words at different addresses. So, there exists correspondence between the original address of a word and its physical address in the memory, the word being reconstituted at output of the memory block by the process of selection of the groups of P bits and their dispatch in the form of serial data.

B) Architecture of a FLASH memory according to the invention

Figure 14:
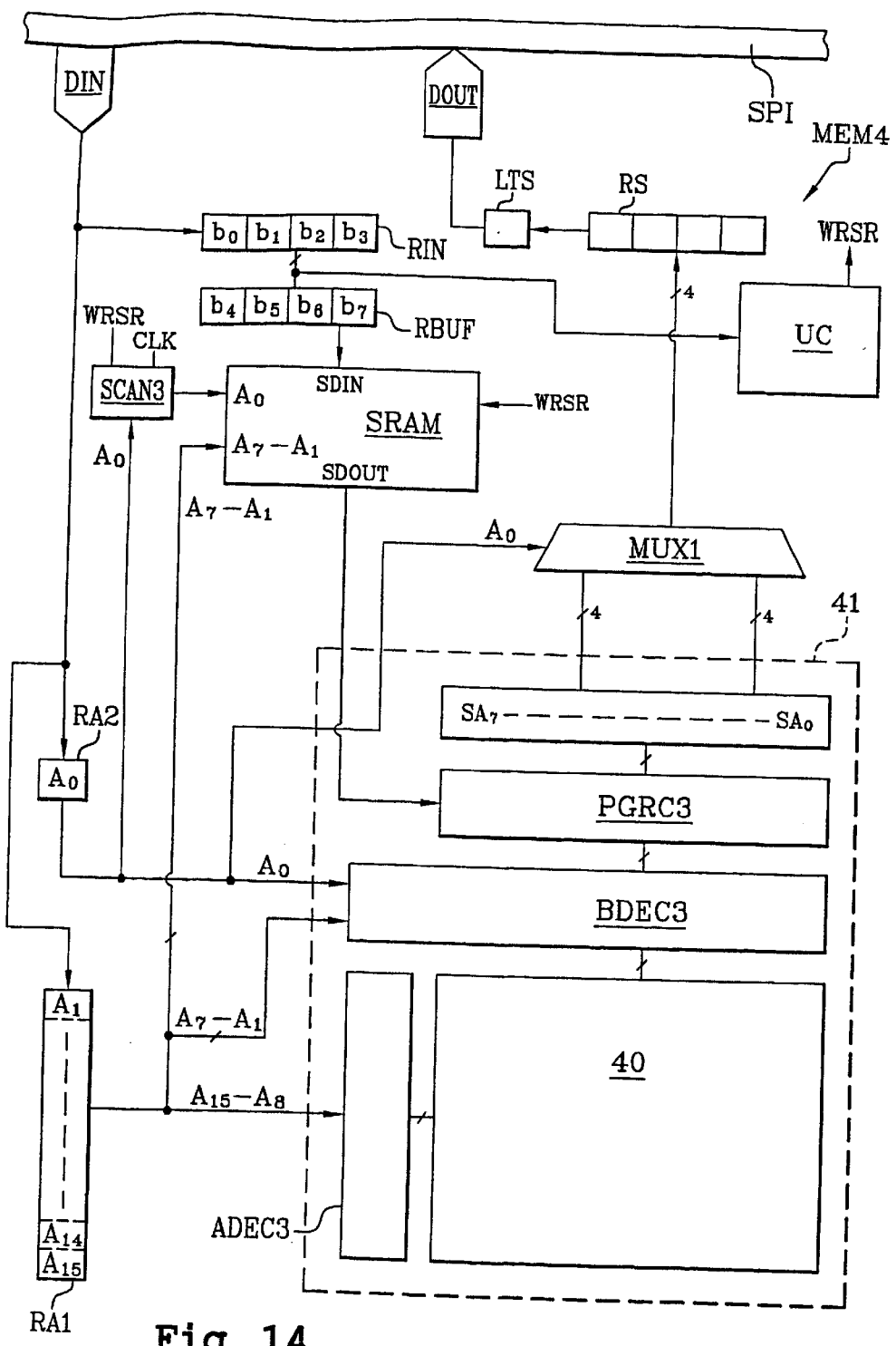
FIG. 14 is a schematic diagram showing the architecture of a serial memory according to the invention made out of a memory block of FIG. 13.

FIG. 14 shows the architecture of a memory MEM4 made out of the memory block FLASH 41 and various peripheral elements already described here above, such as the ports DIN, DOUT, the input registers RA1, RA2 (for the addresses) and RIN (for the data and the operation codes), the selection circuit MUX1 connected to read circuits $SA_7$-$SA_1$, the output registers RS, LS and the central processing unit UC. The input register RIN is herein a 4-bit register.

The FLASH memory MEM4 comprises, like the EEPROM memory MEM2, the circuit SCAN1 activated or inhibited by the signal READ, the output of which is fed into the address input $A_0$ of the decoder BDEC3 and it delivers the cyclical bit $A_0$, during the read operations. The memory MEM4 works thus in read mode like the memory MEM2 although the implementation to reach this result is different.

The memory MEM4 is essentially distinguished from the memories MEM2, MEM3 in that it comprises a word-interlacing device external to the memory block 31, laid out on the data path of the memory MEM4, namely between the port DIN and the input of the memory block 41. The external interlacing device comprises a volatile buffer memory, herein a SRAM memory, whose output SDOUT is connected to the data bus DB of the programming circuit PGRC3. The input SDIN of the SRAM memory is connected to the parallel output of the input register RIN via a four-bit buffer register RBUF. The address input of the buffer SRAM memory receives the address bits $A_7$-$A_1$ delivered by the register RA1 and receives the least significant address bits $A_0$ via a circuit SCAN3 whose structure is identical to that of the circuit SCAN1. The circuit SCAN3 is however activated or inhibited by a write signal WRSR of the SRAM memory instead of being activated by the signal READ like the circuit SCAN1.

Figure 15:
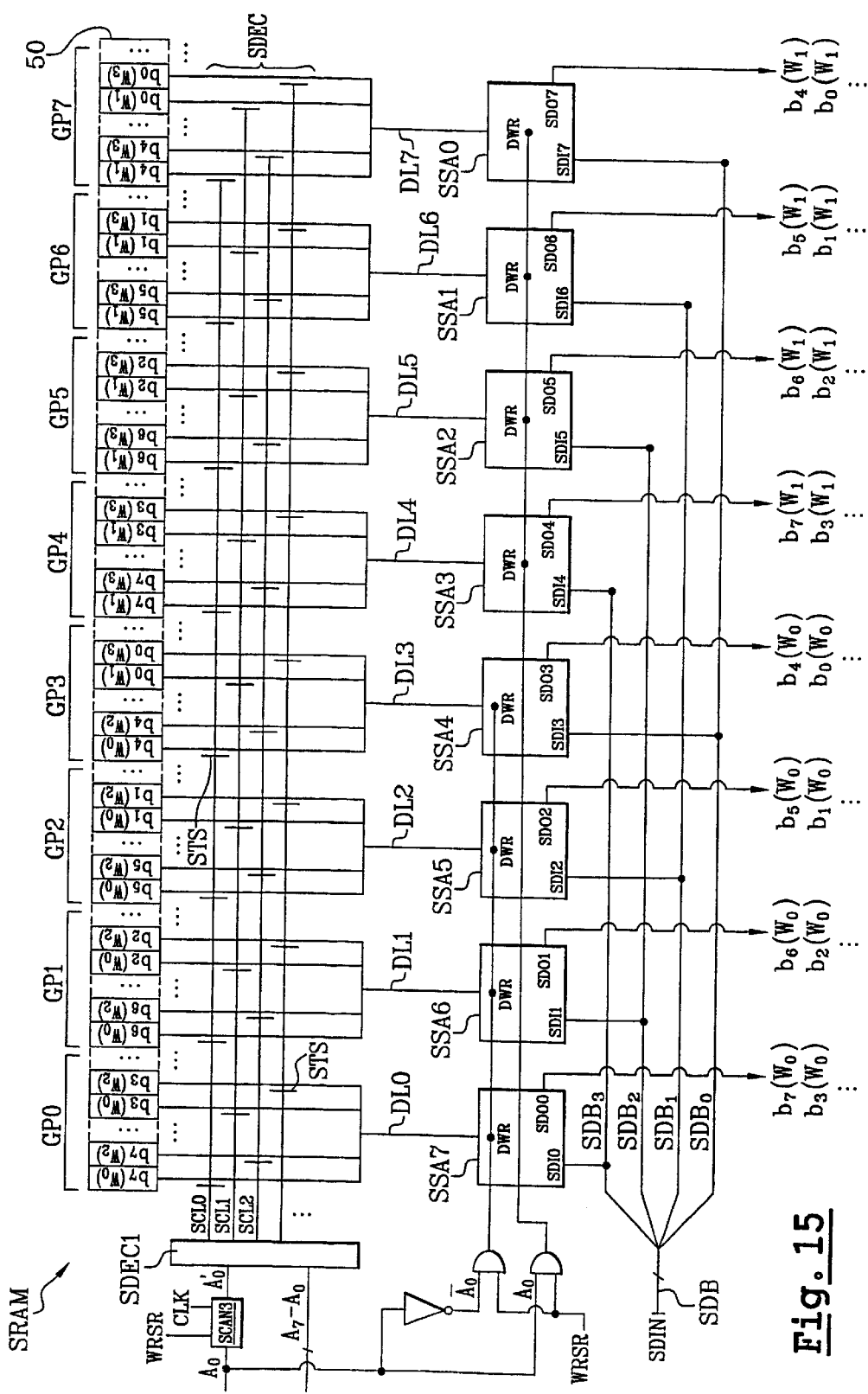
FIG. 15 is a schematic diagram showing the architecture of a buffer memory according to the invention shown in block form in FIG. 14.

The architecture of the SRAM memory is represented in FIG. 15 and is known. The memory SRAM has a memory array 50, read/write circuits $SSA_0$ to $SSA_7$, a data bus SDB connected to the input SDIN of the SRAM memory, comprising four wires $SDB_0$ to $SDB_3$, and an address decoder SDEC comprising selection transistors STS driven by a decoding block SDEC1. Each read/write circuit $SSA_0$ to $SSA_7$ comprises a write activation input DWR, a data input $SDI_0$ to $SDI_7$, a data output $SDO_0$ to $SDO_7$. The memory array 50 preferably has as many volatile memory cells as there are FLASH memory cells in a page of the FLASH memory array 40. The cells are arranged in eight groups of cells $GP_0$ to $GP_7$. The cells of each group $GP_0$ to $GP_7$ are connected to a common line $DL_0$ to $DL_7$ via selection transistors STS of the decoder SDEC, each common line $DL_0$ to $DL_7$ being connected to one of the read/write circuits $SSA_0$ to $SSA_7$. The positioning of the decoder SDEC is standard, the connections between the outputs $SCL_0, SCL_1, \ldots$, the decoding block SDEC2 and the selection transistors STS being such that the application of an applied address leads to the selection of a cell of each group.

According to the invention, the read/write circuits with the rank j+P, herein with a rank j+4, are connected to one and the same wire of the data bus SDB. Thus, the circuits $SSA_7$ and $SSA_3$ are connected to the wire SDB3, the circuits $SSA_6$ and $SSA_2$ are connected to the wire SDB2, the circuits $SSA_5$ and $SSA_1$ are connected to the wire SDB1 and the circuits $SSA_4$ and $SSA_0$ are connected to the wire SDB0. Furthermore, the inputs DWR of the circuits $SSA_7$ to $SSA_4$ receive the write signal WRSR via an AND gate receiving at its other input the reverse bit/$A_0$ of a least significant address bit $A_0$, taken at the output of the register RA2. The inputs DWR of the circuits $SSA_3$ to $SSA_0$ receive the write signal WRSR via an AND gate receiving the bit $A_0$ at its other input. Thus, a group of four bits presented to the input SDIN of the SRAM memory is recorded in cells of the groups $GP_0$ to $GP_3$ when the bit $A_0$ is at 0 (even parity address) and is recorded in the cells of the groups $GP_4$ to $GP_7$ when the bit $A_0$ is at 1 (odd parity address).

A word write operation shall now be described referring jointly to FIGS. 14 and 15. The write operation proper begins after reception of the instruction code $[CODE_{OP}]$, the address $A_{15}$-$A_0$ for the recording of the word, and reception of the first four bits of the word in the register RA1. It is assumed here, by way of an example, that the address bit $A_0$ is equal to 0. The write signal WRSR is set at 1, the circuit SCAN3 starts and the bit $A_0'$ is set at 0 for a duration of four clock cycles. The four bits of the word are transferred to the input SDIN of the SRAM memory via the buffer RBUF while the first bit of the four following bits is received. The address bit $A_0$ being equal to 0, the write signal WRSR is filtered by one of the AND gates and reaches only the circuits $SSA_7$ to $SSA_4$. Thus, the first four bits are recorded in cells of the groups $GP_7$ to $GP_4$ of the SRAM memory by the circuits $SSA_7$ to $SSA_4$ (FIG. 15). When the four clock cycles CLK have been completed, the four following bits of the word are transferred to the input SDIN while the circuit SCAN3 places the bit $A_0'$ at 1. The second group of bits is again recorded in the cells of the groups $GP_7$ to $GP_4$ because the address bit $A_0$ is always equal to 0. However, the recording address is different since the bit $A_0'$ applied to the address decoder SDEC is now at 1. This is the odd parity address immediately following the even parity address for the recording of the first four bits.

These operations are performed under the control of the central processing unit UC which delivers the necessary signals. In the end, the word is split up into two groups of bits recorded at two successive addresses of this SRAM memory. If a second binary word with an odd parity address ($A_0=1$) having the same partial address as the first one is recorded in the SRAM memory, the two groups of bits of the second word are recorded in cells of the groups $GP_3$ to $GP_0$ because the address bit $A_0$ is equal to 1. At the end of the recording of the second word, two composite words with even parity and odd parity addresses are found in the memory, each comprising four most significant bits or least significant bits of the original two words.

Ultimately, the SRAM memory has an interlacing of bits according to the one set forth in the chart of FIG. 16. When several words are recorded successively in the SRAM memory, the central processing unit UC transfers them one after the other into the FLASH memory block 41 by successive steps of reading the SRAM memory and steps of writing in the FLASH memory block. Each transfer step is done by applying the same least significant address $A_7$-$A_0$ to the SRAM memory and the decoder BDEC3 of the FLASH memory block. Since the words read are composite words, the interlacing present in the SRAM memory is transferred as such into the FLASH memory block.

This embodiment of the present invention has various advantages. Firstly, it enables the implementation of the method of the invention via a conventional FLASH memory block that can be chosen from a library of standard integrated circuits. In practice, the making of a SRAM buffer memory of the above-mentioned type may prove to be simpler than the fact of having to make a specific FLASH memory block like that of the memory MEM3 described further above. Another advantage of this embodiment is that it enables the sequential recording of a sequence of words in the buffer memory, before the words are transferred into the FLASH memory block. The buffer memory thus enables the simulation of the page mode of the EEPROM memories. This can be done neither by the standard FLASH memories nor by the memory MEM3 described further above. However, the memory MEM3 could be preferred to the memory MEM4 in applications where the page mode is not necessary.

The buffer memory according to the invention is of course capable of undergoing various alternative embodiments. It may comprise for example only 16 memory cells for the recording of two binary words in the form of two composite words, if a page mode operation is not desired.

Furthermore, the interlacing of the binary words may be done in another way. Thus, in one variant, the binary words are recorded normally in the buffer memory and interlaced at the time of their transfer into the FLASH memory block. To this end, a mixer circuit is planned between the output of the buffer memory and the input of the FLASH memory block. The mixer circuit has, for example, two buffer registers of 8 bits each, receiving the two words to be interlaced, the outputs of which are interlaced and applied to the input of the FLASH memory block via a multiplexer circuit. The multiplexer circuit is driven by a scanning circuit having the same structure as the circuit SCAN3.

4) Summary of embodiments described

Here above, we have described three detailed embodiments of a read-ahead serial memory, requiring only K read circuits to read K-bit words (against M times K read circuits in the prior art read-ahead memories). The first memory MEM2 comprises a block memory having a specific read path delivering composite words from words recorded without interlacing. The second memory MEM3 comprises a memory block provided with a certain specific write path providing for the interlacing of the words when they are recorded, and a read path appropriate to the reading of composite words. The third memory MEM4 comprises a standard FLASH memory block provided with a buffer memory for the conversion of received words into composite words before they are recorded in the memory block and/or the simulation of the page programming mode, it being possible for the interlacing of the words to be done also by a mixer positioned between the output of the buffer memory and the input of the FLASH memory block.

As a rule, the embodiments are capable of being made in different variants and combinations. Furthermore, although the present description has been given with reference to EEPROM and FLASH memory structures, it goes without saying that the present invention can be applied to various other types of memory. The present invention can be applied especially to PROM memories which, owing to their structures, are midway between FLASH memories and EEPROM memories.

That which is claimed is:

1. A method for reading a binary word in a serial input/output memory comprising:

upon reception of a partial read address, in which there are N least significant bits lacking from a complete read address, simultaneously reading P first bits of M words of the memory having the partial read address;

upon reception of the complete read address, selecting P first bits of a word designated by the complete read address and delivering the P first bits at a serial output of the memory;

reading P following bits of the word designated by the complete read address during delivery of P previous bits; and delivering the P following bits at the serial output of the memory when the P previous bits are delivered.

2. The method according to claim 1, wherein reading P following bits comprises:

simultaneous reading P following bits of the M words of the memory having the partial read address; and selecting the P following bits of the word designated by the complete read address.

3. The method according to claim 1, wherein the memory includes memory cells arranged in word lines and bit lines, and the bits lines are arranged in columns, wherein the method comprises:

providing an address decoder for the simultaneous selection, after the complete address has been received by the address decoder, of P bit lines of M different columns; and providing an interconnection bus for connecting each of the selected P bit lines to a read circuit.

4. The method according to claim 3, wherein the simultaneous reading of P first bits of M words of the memory comprises:

applying, to the decoder, the partial read address received; and scanning, on least significant address inputs of the decoder, $2^N$ possible combinations of N last address bits.

5. The method according to claim 1, wherein the memory comprises cells arranged in word lines and bit lines, with one word line forming a memory page, the method further comprising:

recording M words of a same partial read address in M adjacent sub-pages of a memory page;

recording each word in P adjacent groups of cells each comprising K/P adjacent sub-groups of cells, K being the number of bits of each word; and recording j and j+1 ranking bits of a word in adjacent groups of cells and j and j+P ranking bits of a word in adjacent sub-groups of cells so that the words are folded in the sub-pages.

6. The method according to claim 5, wherein simultaneous reading P first bits of M words of the memory comprises:

simultaneous selection, in read mode, in each group of cells of each sub-page of the memory, of all the cells containing the bits of the M words having the same partial read address; and connecting the cells containing one of the P targeted bits of each of the M words to a read circuit.

7. The method according to claim 1, wherein P is equal to K/M, K being the number of bits included in the words stored in the memory, M being equal to $2^N$.

8. The method according to claim 1, wherein N is equal to 1 and M is equal to 2.

9. The method according to claim 1, wherein the P first bits of each of the words read simultaneously in the memory are most significant bits.

10. A method for reading data from a memory comprising:

simultaneously reading P bits of M words of the memory having a partially received read address which is missing N least significant bits from a complete read address;

selecting P bits, upon reception of the complete read address, of a word designated by the complete read address;

outputting the P bits;

reading P following bits of the word designated by the complete read address while outputting the P bits; and outputting the P following bits when the P bits are outputted.

11. The method according to claim 10, wherein reading P following bits comprises:

simultaneous reading P following bits of the M words of the memory having the partial read address; and selecting the P following bits of the word designated by the complete read address.

12. The method according to claim 10, wherein the memory includes memory cells arranged in word lines and bit lines, and the bits lines are arranged in columns, wherein the method comprises:

providing an address decoder for the simultaneous selection, after the complete address has been received by the address decoder, of P bit lines of M different columns; and providing an interconnection bus for connecting each of the selected P bit lines to a read circuit.

13. The method according to claim 12, wherein the simultaneous reading of P first bits of M words of the memory comprises:

applying, to the decoder, the partial read address received; and scanning, on least significant address inputs of the decoder, $2^N$ possible combinations of N last address bits.

14. The method according to claim 10, wherein the memory comprises cells arranged in word lines and bit lines, with one word line forming a memory page; the method further comprising:

recording M words of a same partial read address in M adjacent sub-pages of a memory page;

recording each word in P adjacent groups of cells each comprising K/P adjacent sub-groups of cells, K being the number of bits of each word; and recording j and j+1 ranking bits of a word in adjacent groups of cells and j and j+P ranking bits of a word in adjacent sub-groups of cells so that the words are folded in the sub-pages.

15. The method according to claim 14, wherein simultaneously reading P first bits of M words of the memory comprises:

simultaneous selection, in read mode, in each group of cells of each sub-page of the memory, of all the cells containing the bits of the M words having the same partial read address; and connecting the cells containing one of the P targeted bits of each of the M words to a read circuit.

16. The method according to claim 10, wherein P is equal to K/M, K being the number of bits included in the words stored in the memory, M being equal to $2^N$.

17. The method according to claim 10, wherein N is equal to 1 and M is equal to 2.

18. The method according to claim 10, wherein the P first bits of each of the words read simultaneously in the memory are most significant bits.

19. An integrated circuit memory comprising:

a reading circuit for simultaneously reading P bits of M words of the memory having a partially received read address in which N least significant bits are missing from a complete address; and a selection circuit for selecting the P bits, when the complete address is received, of the word designated by the complete address and outputting the P bits;

the reading circuit reading P following bits of the word designated by the complete address while the P bits are being outputted, and the selection circuit outputting the P following bits when the P bits are outputted.

20. The memory according to claim 19, further comprising a group selection circuit for selecting a group of P bits among M groups of P bits read simultaneously, while receiving, at a control input, the N least significant bit of the complete address.

21. The memory according to claim 19, further comprising:

memory cells arranged in word lines and bit lines, the bit lines being arranged in columns;

an address decoder for the simultaneous selection of P bit lines of M different columns of the same partial address; and an interconnection bus to connect each of the selected P bit lines to the read circuit.

22. The memory according to claim 21, further comprising an address scanning circuit for scanning, during a reading operation, of the $2^N$ possible combinations of the N least significant bits of the complete address applied to the address decoder.

23. The memory according to claim 19, further comprising:
    memory cells arranged in word lines and bit lines, a word line forming a memory page;
    a bit interlacing device for recording M words of the same partial address in M adjacent sub-pages of a memory page; for recording each word in P adjacent groups of cells each comprising K/P adjacent sub-groups of cells, K being the number of bits of each word, and for recording j and j+1 ranking bits of a word in adjacent groups of cells, and j and j+P ranking bits of a word in adjacent sub-groups of cells so that the words are folded in the sub-pages.

24. The memory according to claim 23, further comprising an address decoder comprising:
    bit line selection switches; and
    a programming circuit for programming the memory, the programming circuit comprising M times K latch circuits connected at input to a data bus having K wires;
    wherein the bit lines of one and the same sub-group of cells are connected to a common line via the selection switches, each common line is connected to the output of a latch circuit, and the latch circuits connected at output to sub-groups of cells of the same rank belonging to different sub-pages are connected to a same wire of the data bus.

25. The memory according to claim 24, wherein the address decoder comprises an inhibiting device for, in read mode, inhibiting N least significant address inputs, to simultaneously select all the bit lines corresponding to the bits of all the words of the memory having the same partial address.

26. The memory according to claim 25, wherein the common lines of the sub-groups of cells of the same group of cells are connected to the same read circuit via a multiplexer circuit for connecting, to the read circuit, only one common line at a time, designated by a control signal of the multiplexer circuit.

27. The memory according to claim 26, wherein the multiplexer circuit is driven by a scanning circuit for scanning, during an operation of reading a word, of all the multiplexing values of the control signal, so that the common lines of each sub-group of the same group of cells are connected to the read circuit one after the other.

28. The memory according to one claim 19, further comprising:
    a memory block;
    peripheral elements to the memory block; and
    a bit interlacing device connected adjacent the memory block for presenting, at an input of the memory block, composite words comprising M groups of P bits of M different binary words.

29. The memory according to claim 28, further comprising:
    a volatile type buffer memory having an output connected to the input of the memory block; and
    a recorder for recording, in the buffer memory, data elements that have to be recorded in the memory block, and then recording, in the memory block, the data elements previously recorded in the buffer memory.

30. The memory according to claim 29, further comprising a second recorder for recording, in the buffer memory, composite words comprising M groups of P bits of M different binary words received in serial form.

31. The memory according to claim 19, wherein P is equal to K/M, K being the number of bits included in the words stored in the memory, M being equal to $2^N$.

32. The memory according to claim 19, wherein N is equal to 1 and M is equal to 2.

33. An integrated circuit serial input/output memory comprising:
    a serial output;
    a reading circuit for simultaneously reading P first bits of M words of the memory having a partially received read address in which N least significant bits are missing from a complete address; and
    a selection circuit for selecting the P first bits, when the complete address is received, of a word designated by the complete address and outputting the P first bits at the serial output of the memory;
    the reading circuit reading P following bits of the word designated by the complete address while the P first bits are being outputted, and the selection circuit outputting the P following bits at the serial output after the P first bits are outputted.

34. The integrated circuit serial input/output memory according to claim 33, further comprising a group selection circuit for selecting a group of P bits among M groups of P bits read simultaneously, while receiving, at a control input, the N least significant bits of the complete address.

35. The integrated circuit serial input/output memory according to claim 33, wherein P is equal to K/M, K being the number of bits included in the words stored in the memory, M being equal to $2^N$.

36. The integrated circuit serial input/output memory according to claim 33, wherein N is equal to 1 and M is equal to 2.

* * * * *

UNITED STATES PATENT AND TRADEMARK OFFICE
CERTIFICATE OF CORRECTION

PATENT NO. : 6,477,101 B2 Page 1 of 1
DATED : November 5, 2002
INVENTOR(S) : Cavaleri et al.

It is certified that error appears in the above-identified patent and that said Letters Patent is hereby corrected as shown below:

Column 5,
Lines 19 and 23, delete "REG1" insert -- REG2 --

Column 15,
Line 29, delete "$0000^H$" insert -- $0000_H$ --
Line 30, delete "$0001^H$" insert -- $0001_H$ --

Column 17,
Line 32, delete "$b_7(W_1)-b_4(W_j)-b_7(W_{j+1})-b_4(W_{j+1})$" insert
-- $b_7(W_1)-b_4(W_j)\ b_7(W_{j+1})-b_4(W_{j+1})$ --

Signed and Sealed this

Twenty-ninth Day of July, 2003

JAMES E. ROGAN
*Director of the United States Patent and Trademark Office*